United States Patent
Murphy et al.

(10) Patent No.: US 7,301,095 B2
(45) Date of Patent: *Nov. 27, 2007

(54) SOLAR CELL ARRAY

(75) Inventors: David M. Murphy, Santa Barbara, CA (US); Michael I. Eskenazi, Goleta, CA (US); Brian R. Spence, Solvang, CA (US)

(73) Assignee: AEC-Able Engineering Co., Inc., Goleta, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/249,143

(22) Filed: Oct. 11, 2005

(65) Prior Publication Data

US 2006/0174930 A1    Aug. 10, 2006

Related U.S. Application Data

(63) Continuation of application No. 10/351,454, filed on Jan. 24, 2003, now abandoned, which is a continuation of application No. 09/559,815, filed on Apr. 25, 2000, now abandoned, which is a continuation-in-part of application No. 09/337,624, filed on Jun. 21, 1999, now Pat. No. 6,177,627.

(51) Int. Cl.
*H01L 25/00* (2006.01)

(52) U.S. Cl. ..................... 136/246; 136/292

(58) Field of Classification Search ........ 136/243–265, 136/291–292
See application file for complete search history.

(56) References Cited

U.S. PATENT DOCUMENTS

| | | | |
|---|---|---|---|
| 3,232,795 A | 2/1966 | Gillette | |
| 3,350,234 A | 10/1967 | Ule | |
| 3,427,200 A | 2/1969 | Lapin et al. | |
| 3,802,920 A * | 4/1974 | Salles et al. | ............... 136/244 |
| 4,134,387 A | 1/1979 | Tornstrom | |
| 4,313,422 A | 2/1982 | McEntee | |
| 4,316,448 A | 2/1982 | Dodge | |
| 4,384,164 A | 5/1983 | Richard | |
| 4,415,759 A | 11/1983 | Copeland et al. | |

(Continued)

FOREIGN PATENT DOCUMENTS

| | | |
|---|---|---|
| JP | 4-215599 A | 8/1992 |
| WO | WO 95/06330 | 3/1995 |

OTHER PUBLICATIONS

Eugene L. Ralph et al., G-Star Space Solar Array Design, 28th IEEE PVSC, Sep. 2000.

*Primary Examiner*—Nam Nguyen
*Assistant Examiner*—Jeffrey Barton
(74) *Attorney, Agent, or Firm*—TraskBritt

(57) ABSTRACT

A solar panel for a spacecraft has a base with a face, and at least one row of solar cells and at least one elongated reflector are mounted on the face of the base. The reflectors and the rows are mounted generally parallel to each other in an alternating fashion. The reflector has first and second reflecting sides when the reflector is in a deployed position. The reflector is mounted so that the first side of the reflector is adjacent to a row of solar cells and reflects radiation incident on the first side onto the adjacent row of solar cells when the reflector is in a deployed position. Preferably, a plurality of rows and a plurality of reflectors are mounted on the face of the base, with at least one of the reflectors being disposed between two adjacent rows of solar cells.

30 Claims, 16 Drawing Sheets

U.S. PATENT DOCUMENTS

| | | |
|---|---|---|
| 4,784,700 A | 11/1988 | Stern et al. |
| 5,131,955 A * | 7/1992 | Stern et al. ............... 136/245 |
| 5,178,685 A | 1/1993 | Borenstein et al. |
| 5,288,337 A | 2/1994 | Mitchell |
| 5,344,496 A | 9/1994 | Stern et al. |
| 5,496,414 A | 3/1996 | Harvey et al. |
| 5,520,747 A | 5/1996 | Marks |
| 5,578,139 A | 11/1996 | Jones et al. |
| 5,885,367 A | 3/1999 | Brown et al. |
| 5,979,834 A | 11/1999 | Falbel |
| 6,017,002 A | 1/2000 | Burke et al. |
| 6,177,627 B1 | 1/2001 | Murphy et al. |
| 6,188,012 B1 | 2/2001 | Ralph |
| 6,528,716 B2 | 3/2003 | Collette et al. |
| 2002/0007845 A1 | 1/2002 | Collette et al. |

* cited by examiner

SOLAR CELL ARRAY

CROSS-REFERENCE TO RELATED APPLICATIONS

This application is a continuation of application Ser. No. 10/351,454, filed Jan. 24, 2003 now abandoned, which is a continuation of application Ser. No. 09/559,815, filed Apr. 25, 2000 now abandoned, which is a continuation-in-part of application Ser. No. 09/337,624, filed Jun. 21, 1999, now U.S. Pat. No. 6,177,627, issued Jan. 23, 2001, which are hereby incorporated by reference as if they were set forth herein in their entirety.

FIELD OF THE INVENTION

The present invention relates to solar cell arrays for use on spacecraft and, in particular, solar cell arrays for powering spacecraft during long missions in space.

BACKGROUND OF THE INVENTION

Spacecraft generally use solar cells to collect solar radiation and convert it into the electrical power necessary to operate the spacecraft. The solar cells are normally disposed on a solar array. A solar array typically comprises one or more solar panels electrically attached to each other and to the spacecraft. Each solar panel in an array typically comprises numerous individual solar cells, which are usually laid out in rows and connected together electrically at their adjacent edges. These photocells form a two-dimensional array and are frequently mounted on a solar panel comprising lightweight graphite face sheets covering a honeycomb core. When multiple solar panels are connected together to power the spacecraft, these panels must fold up, typically accordion style, prior to launch and unfold once in orbit.

The number of solar cells that must be employed is a function of the anticipated spacecraft power demand and the efficiency of the cells. High-efficiency solar cells are typically employed to reduce the area of photovoltaics required by a specific spacecraft. This reduces panel area and thus overall mass from the required supporting structure and minimizes the volume of the stowed power system. But such cell devices are quite expensive. Because system cost and mass both increase directly with the number of solar cells employed, there is considerable incentive to reduce the quantity of solar cells that a spacecraft must carry on an array.

The efficiency of solar panels for spacecraft is generally evaluated on the basis of numerous criteria, including watts per kilogram, watts per cubic meter (stowed), and watts per dollar. Solar cells are the most expensive component of a solar array. To reduce solar array cost, solar concentrators may be used to reduce the number of cells. Lightweight reflective surfaces have been used in various combinations with known solar panels to improve their efficiency. Examples of such combinations are disclosed in U.S. Pat. No. 6,017,002 to Burke et al. for Thin-Film Solar Reflectors Deployable From An Edge-Stowed Configuration, U.S. Pat. No. 5,520,747 to Marks for a Foldable Low Concentration Solar Array, and U.S. Pat. No. 5,885,367 to Brown et al. for a Retractable Thin Film Solar Concentrator For Spacecraft, which all use large deployable sheets to reflect onto the solar panel as depicted in FIG. 8 herein. These patents are all incorporated herein by reference as if set forth in their entirety. As can be seen, use of these so called "full panel reflector systems" greatly increases the collection area of the solar panel. One considerable drawback of such full panel reflector systems, however, is that because the collection area of the solar panel is large in comparison to the panel's radiative area, the solar cells operate at high temperature, which reduces their efficiency. Another potential drawback of full panel reflector systems is that because the reflectors are large in comparison to the area of an individual solar cell, relatively minor distortions in the reflectors can cause significant differentials in the amount of solar energy reflected onto each cell, which in turn can impair the efficiency of the panel. Similarly, because the reflector in full panel reflector systems is far away from at least some of the solar cells on the panel, small distortions in the reflector can cause significant differentials in the amount of light reflected onto the individual solar cells.

As noted above, the harvesting of a large cross-sectional area of solar energy from a smaller area of solar cells by concentration is a well-recognized art for spacecraft and has been used to improve the efficiency and other performance parameters of known solar panels. Numerous other techniques are employed terrestrially, including using lenses such as Fresnel lenses to refract the energy onto the cells, and large mirror arrangements to reflect the energy onto the cells. However effective these known devices may be in directing energy from a larger area onto a smaller area, they bring with them many problems of practical concern when used for spacecraft.

Designing land-based apparatus to capture solar energy involves fewer constraints. The apparatus is built in place and stays there. It need not automatically deploy into configuration. Weight is no concern, and neither is perfect reliability, because within reason, the apparatus is accessible and readily repaired. Structural efficiency is really not an issue; a ground-based device may simply be made as heavy and strong as desired, with a generous allowance for safety. Thus, the weight, reliability, and rigidity of the apparatus do not impose any special concerns for the design of land-based solar energy systems. Nor does the variability of environmental conditions such as temperature create any special design concerns. In land-based solar energy systems, nearly all design concerns can be minimized or corrected by over-design of the apparatus.

Such is not the circumstance for spacecraft. Weight is a primary consideration, not only because of the cost per kilogram to launch the apparatus, but because weight of one part of a spacecraft will necessarily require a reduction of weight elsewhere due to the ultimate limitation on the total launch weight of the entire craft.

Reliability is also a prime concern. Spacecraft are one-way vehicles. Once in space, they remain there during their useful life, and except in a few extraordinary situations such as the Hubble Telescope, they will never be approached after launch. The failure of apparatus such as a solar array dooms all or a large part of the intended life and function of the entire craft.

Rigidity in the sense of maintenance of shape under varying conditions is made complicated by the extreme variations in temperature as the apparatus enters and leaves the shadow of the earth. While in the shadow, temperatures as low as −180° C. are endured. While out of the shadow and exposed directly to the sun, temperatures as high as 110° C. are endured. When the solar panels transition between light and shadow, the change in temperature of the apparatus occurs in only a few minutes, and does not occur uniformly throughout. This results in a reaction known as "thermal snap" in which the distortions that result from rapid temperature change cause a quick bending distortion that shudders the spacecraft and can damage the array. As the wing temperatures change over the sunlit portion of the orbit, distortions of the structure can cause the concentrator optics to malfunction.

High temperatures are also the enemy of solar cells. The efficiency of solar cells decreases as their temperature increases. It is, therefore, important to mount the cells in an arrangement such that the energy received by them does not heat the cells to an unacceptable temperature.

This is further complicated if large reflecting areas are involved where there may be localized higher temperatures due to distortions of the reflector. The overheated cells will function less efficiently. Even isolated instances of under-performing solar cells can impair the efficiency of the solar panel. The problems created by under-performing solar cells are exacerbated by the fact that the solar cells within individual rows in known solar arrays are electrically connected in series, which means that the electrical output of an entire row of cells will be compromised by even one cell's under-performance.

Thus, it can be seen that there is a daunting array of considerations in the design of solar energy systems for spacecraft. Various arrangements have been proposed in the past for improving the efficiency and resistance to environmental and hostile threats of solar energy systems. Over the decades, there has been a long succession of solar arrays produced and launched. Many have been successful, but a disheartening proportion of them have failed partially or totally, causing the loss of very costly space vehicles, or a major reduction in their useful life.

A need, therefore, exists for a solar cell array configuration that optimizes solar collection without risking non-uniform cell illumination or unacceptably increasing the temperature of the solar cells and thereby impairing their efficiency. A need further exists for such a system that is simple, lightweight, and reliable in deployment and operation.

SUMMARY OF THE INVENTION

An object of the present invention is to provide an improved solar panel for use in powering spacecraft during missions in space. In particular, it is an object of the present invention to reduce solar array cost and mass using an improved solar panel/reflective collector combination that is simple in design and has improved efficiency, while reducing non-uniform cell-to-cell illumination as well as the thermal issues attendant in the prior art solar panel/reflective collector combinations.

To this end, in one aspect of the invention, a solar panel is provided that comprises a base having a front surface, a row of solar cells mounted on the front surface of the base, and an elongated collapsible, self-deploying reflector mounted on the front surface of the base. The reflector has a first and a second reflecting side that preferably are substantially symmetrically disposed about a longitudinal bisecting plane that is perpendicular to the base and is parallel and coincident with the longitudinal axis of the reflector when the reflector is in a deployed position. The reflector is preferably mounted so that the longitudinal axis of the reflector is parallel to the rows of solar cells. The reflector is further mounted so that one of the reflecting sides of the reflector is adjacent to one of the rows of solar cells. As a result, radiation incident on the reflector is reflected onto the adjacent row of solar cells when the reflector is in the deployed position. To maximize the area of collection, preferably, a plurality of parallel rows of solar cells and a plurality of reflectors are employed. The rows of solar cells and the reflectors are preferably mounted in an alternating fashion. Further, the reflectors are preferably substantially coextensive in length to the adjacent row or rows of solar cells.

If a plurality of rows of solar cells are provided, preferably each of the rows of solar cells are spaced apart, and a collapsible reflector is interposed between each of the adjacent rows of solar cells. In addition, a reflector can be provided at each of the end rows of solar cells. In this manner, each row of solar cells will be interposed between two reflectors, and each row of solar cells will have two reflectors reflecting incident radiation onto the row of solar cells.

The collapsible, self-deploying reflectors according to the present invention, when deployed, form a reflector having two reflecting sides that are inclined to the base, preferably by the same angle but in opposite directions. In addition, the reflecting sides preferably are substantially symmetrically disposed about the longitudinal bisecting plane extending through the longitudinal axis of the reflector and perpendicular to the base. As a result, incident radiation is reflected by each of the reflecting sides in opposite directions away from the longitudinal axis of the reflector. In cross section, the reflectors of the present invention preferably have a shape that is similar to an inverted V. However, they may also be trapezoidal in shape, preferably with similar angles between the sides and the base of the trapezoid. The two reflecting sides of the reflector need not be planar. For example, in a preferred embodiment of the invention, the reflecting sides have a concave curved shape. Similarly, the reflecting sides could be stepped or bent. Use of non-planar designs are particularly useful where it is anticipated that the solar panel will not be pointed directly at the sun from time to time, a situation called "off-pointing."

In use, typically a number of solar panels according to the present invention will be attached together by a hinge means, such as a door hinge, a piano hinge, or a living hinge. These solar panels are then folded up, generally accordion style, to reduce volume during launch. The reflectors are collapsible so that they can be easily collapsed against an opposing surface, which can comprise a surface of another solar panel or a surface of another portion of the spacecraft. This ensures that the tightest possible packing of the solar panels can be achieved during launch. The reflectors, preferably, are biased toward a deployed, or operational, position; thus, in the absence of external forces, the reflectors according to the present invention self-deploy. As a result, upon deployment of the solar panel or panels, the external collapsing force created by the opposing surface is removed and the reflectors self-deploy to their deployed, or operational, position.

Because the collapsible, self-deploying reflectors of the present invention need not use any pulleys, gears, cables or the like to deploy, they are very simple in design and reliable. The electrical configurations of the solar panels of the present invention may be designed more robustly because the space beneath the reflectors on the solar panel base may be used advantageously to connect solar cells in a particular row or adjacent rows in novel ways that were heretofore impractical or even impossible. Furthermore, in comparison to full panel reflector systems such as shown in FIG. 8, thermal issues are minimized because the collection area of the solar panels according to the present invention is generally equal to the radiative area, and because each reflector will generally reflect light onto only the adjacent row or rows of cells, the power output from each row of cells is less sensitive to minor distortions in the shape of the reflectors.

Other objects, features and advantages of the invention will become apparent to those skilled in the art from the following description of the preferred embodiments taken together with the drawings.

DETAILED DESCRIPTION OF THE INVENTION

Figure 1:
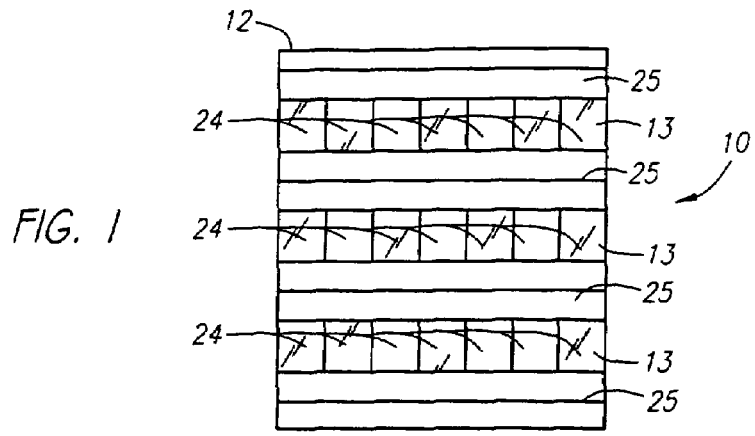
FIG. 1 is a plan view of a solar panel according to one embodiment of the invention.
Figure 1A:
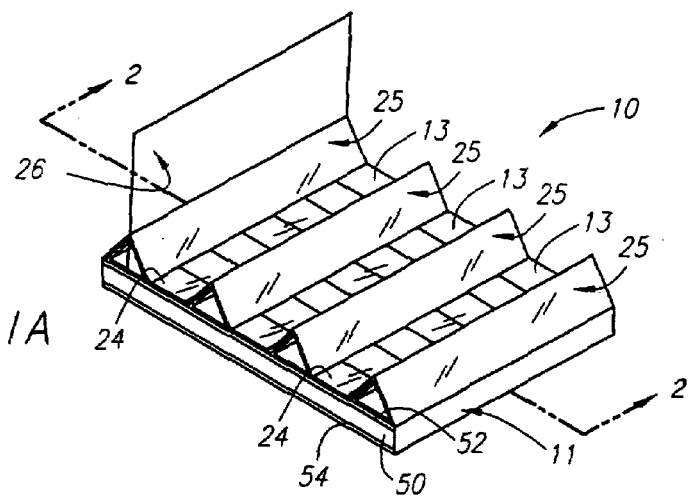
FIG. 1A is a perspective view of the solar panel shown in FIG. 1.
Figure 2:
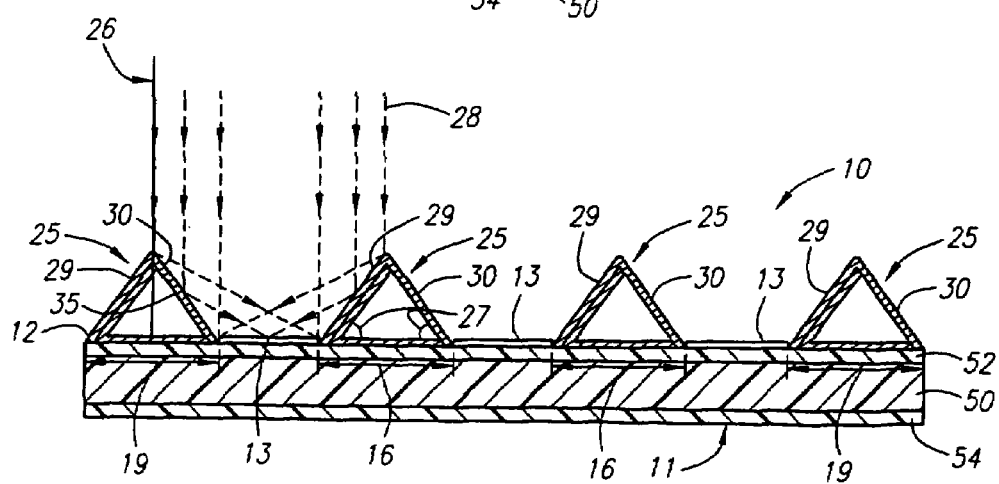
FIG. 2 is a cross-sectional view of the solar panel shown in FIGS. 1 and 1A taken along line 2-2 in FIG. 1A.

A preferred embodiment of a solar panel 10 according to the present invention is shown in FIGS. 1, 1A, and 2.

Solar panel 10 comprises a base 11 having a front surface 12, a plurality of generally parallel rows 13 of solar cells 24 mounted on the front surface 12 of the base 11, and a plurality of elongated collapsible, self-deploying reflectors 25 mounted on the front surface 12 of the base 11. As shown, rows 13 of solar cells 24 and reflectors 25 are preferably mounted on the front surface 12 of base 11 in an alternating fashion. Adjacent rows 13 are, therefore, preferably spaced apart by spacings 16. Edge spacings 19 are also preferably provided next to the two outside rows 13. Elongated reflectors 25, which comprise two reflective sides 29, 30, are then mounted in the spacings 16 provided between the rows 13 and in the edge spacings 19 provided at the edges of the base 11. In this manner, a reflector 25 is interposed between each of the adjacent rows 13 of solar cells 24, and each row 13 of solar cells 24 is interposed between two reflectors 25. Thus, as best illustrated by light rays 28 in FIG. 2, each row 13 of solar cells has two reflectors 25 reflecting incident radiation onto it.

The composition of base 11 is well known in the art, and typically comprises a honeycomb core structure 50 with a front face sheet 52 and a back face sheet 54.

Figure 8:
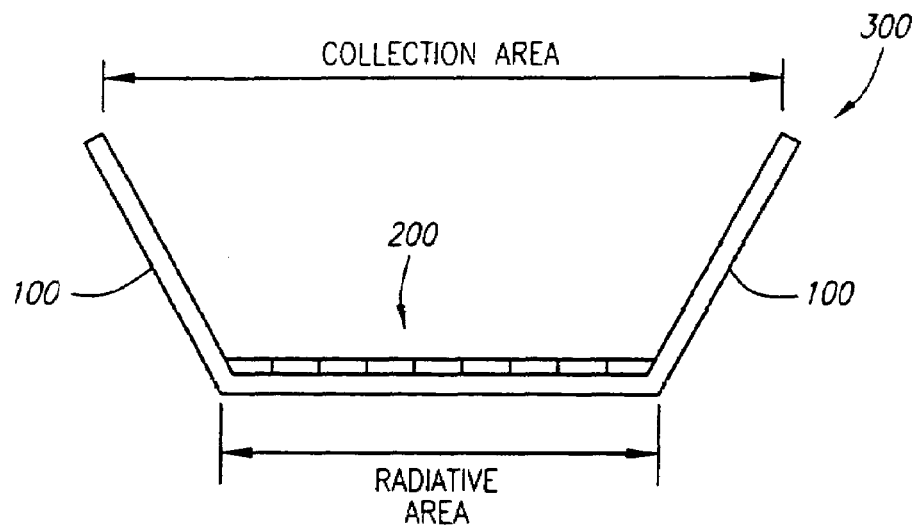
FIG. 8 is an end view of a prior art solar panel with two reflectors disposed at its edges.

The rows 13 of solar cells 24 comprise a plurality of electrically interconnected individual solar cells 24, which are mounted in rows to the front surface 12 of the base 11. The rows 13 can be one individual solar cell 24 in width, as shown in FIG. 1, or can be multiple solar cells 24 in width. An advantage of constructing solar panel 10 so that rows 13 are only one solar cell in width is that it facilitates the use of a wide variety of electrical connection schemes as well as more robust electrical connection schemes that were previously impractical. It also improves the thermal characteristics of solar panel 10 as compared to a solar panel using full panel reflector systems such as shown in FIG. 8. These aspects of the invention are discussed in more detail, infra.

When deployed, each reflector 25 preferably comprises a first and a second reflecting side 29, 30 that are inclined to the base by the same angle 27 but in opposite directions. Reflecting sides 29, 30 preferably (though not necessarily) are substantially symmetrically disposed about a longitudinal bisecting plane 26 that is perpendicular to the base 11 and is parallel to and coincident with the longitudinal axis of the respective reflector 25 when the reflector 25 is in a deployed position. As a result, radiation incident on reflecting sides 29, 30 tends to be reflected by each of the reflecting sides in opposite directions away from the reflector 25 and plane 26.

In cross section, the reflectors 25 of the present invention preferably have a shape that is similar to an inverted V. However, the two sides of the reflector 25 need not be planar as they are illustrated in FIGS. 1, 1A and 2. For example, the sides of the reflector may comprise a concave curved shape. The reflectors may also be trapezoidal in cross-section, preferably with similar angles between the sides and the base of the trapezoid. Thus, it will be appreciated by those skilled in the art that reflectors having a variety of shapes can be effectively used in connection with the present invention and that the invention is not limited to the shapes illustrated herein.

As shown in FIGS. 1, 1A, and 2, reflectors 25 are preferably mounted so that their longitudinal axis is generally parallel to the rows 13 of solar cells. Each reflector 25 is also mounted so that at least one of its reflecting sides 29, 30 is adjacent to one of the rows 13 of solar cells. As a result, radiation incident onto at least one of the sides 29 or 30 of the reflector 25 will be reflected onto an adjacent row 13 of solar cells when the reflector 25 is in the deployed position. For example, only one of the reflecting sides 29, 30 of the reflectors 25 mounted in edge spacings 19 reflect incident radiation onto an adjacent row 13 of solar cells. On the other hand, the two center reflectors 25 mounted in spacings 16 are mounted so that both of their reflecting sides 29, 30 are adjacent to a row 13 of solar cells 24. Thus, radiation incident on both reflecting sides 29, 30 of the reflectors 25 mounted in spacings 16 is reflected onto an adjacent row 13 of solar cells.

To maximize the area of collection, preferably, a plurality of parallel rows of solar cells and a plurality of reflectors are employed. However, the present invention also contemplates the use of a single reflector 25 mounted adjacent to a single row of solar cells. Collection area will also be maximized if each reflector 25 is substantially coextensive in length to its adjacent row (or rows) 13 of solar cells.

As noted, the primary function of the reflectors is to reflect incident energy onto the adjacent row or rows 13 of solar cells 24. In effect, this reduces the necessary solar cell area by a factor determined by the ratio between the frontal exposure of the reflectors 25 and the solar cells 24. In preferred configurations of solar panel 10, it will reduce the cell area by about half. This translates into a profound saving in cost and weight, both of which are important in space applications.

Figure 1B:
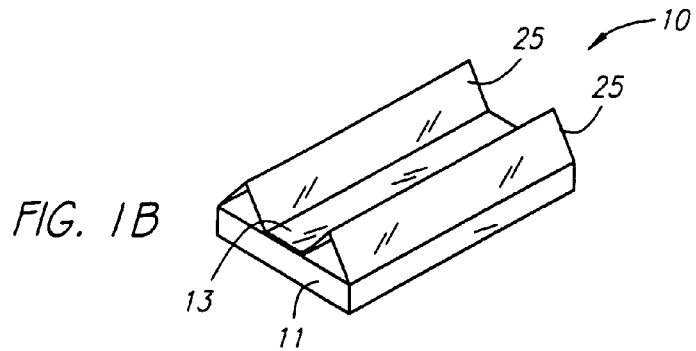
FIGS. 1B through 1F are perspective views of alternative embodiments of a solar panel according to the present invention.
Figure 1C:
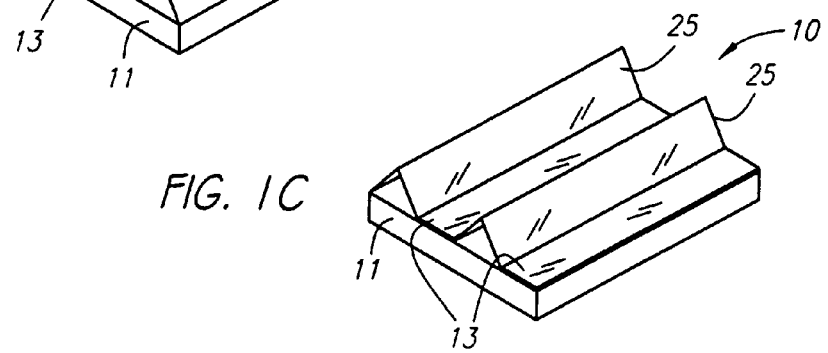
Figure 1D:
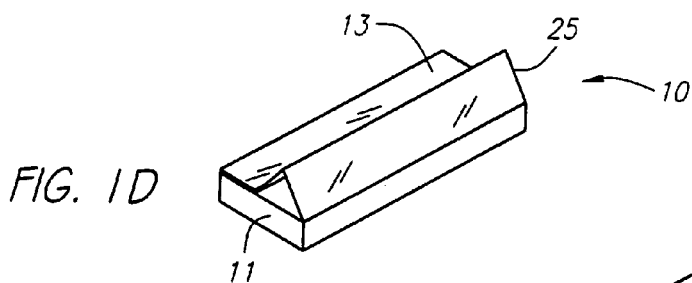
Figure 1E:
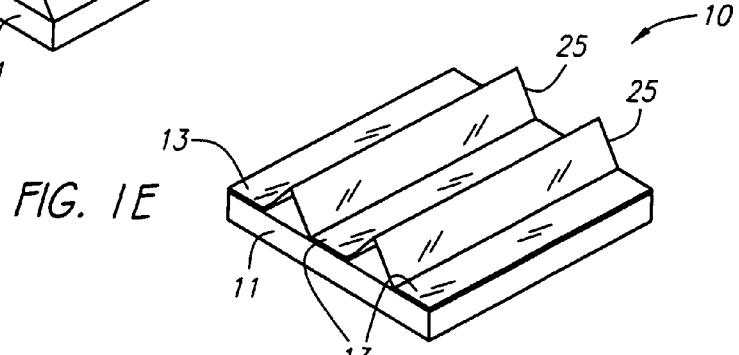
Figure 1F:
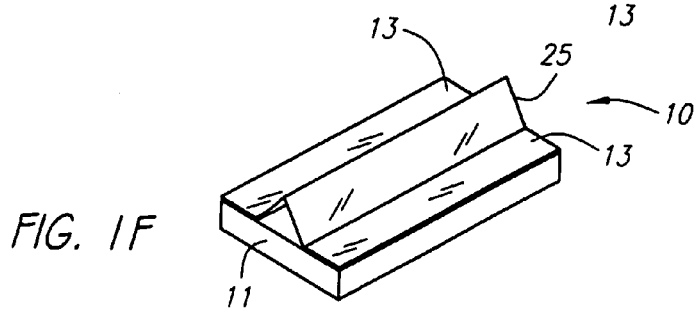

In the embodiment illustrated in FIGS. 1, 1A and 2, solar panel 10 is configured with four reflectors 25 and three interposing rows 13 of solar cells. However, other configurations of solar panel 10 are also contemplated by the present embodiment of the invention as well. Non-limiting examples of such configurations are shown in FIGS. 1B-1F. FIG. 1B shows a solar panel 10 with two reflectors 25 and one row 13 of solar cells. FIG. 1C shows a solar panel 10 with two reflectors 25 and two rows 13 of solar cells. FIG. 1D shows a solar cell with one reflector 25 and one row 13 of solar cells. FIG. 1E shows a solar panel 10 with two reflectors 25 and three rows 13 of solar cells. FIG. 1F shows a solar panel 10 with one reflector 25 and two rows 13 of solar cells. Those skilled in the art will appreciate that the invention also contemplates the use of more than four reflectors and four rows of soalr cells as well as the possibility of having more than one row 13 of solar cells interposed between adjacent reflectors 25.

The reflectors 25 according to the present invention are preferably collapsible so that they can be collapsed to a reduced volume for stowage during launch. The reflectors 25 are also preferably self-deploying so that they can self-erect to their deployed, or operational, configuration upon removal of external forces; that is, the reflectors 25 are preferably biased to erect themselves to their deployed, or operational, configuration in the absence of external forces.

One embodiment of a collapsible, self-deploying reflector 25 of the present invention is depicted in FIGS. 3 through 7. The reflector 25 depicted in FIGS. 3-7 comprises a reflector sheet 35 and an erector 40 that erects the reflector 25 to its deployed configuration from its collapsed, or stowed, configuration. In its deployed configuration, the reflector 25 comprises first and second reflective sides 29, 30, which form, in cross-section, the legs of an inverted V-shape. The reflecting sides 29, 30, therefore, are substantially symmetrically disposed about the longitudinal bisecting plane 26 so that incident radiation is reflected by each of the reflecting sides in opposite directions away from the reflector 25. When erect, a dihedral edge 38 is formed, which is generally parallel to the spacing and to the rows 13 of solar cells 24. The reflector 25 will approximately have the cross-sectional shape of an isosceles triangle.

The reflector sheet 35 preferably comprises a metalized flexible plastic sheet. Naturally, for space applications, the selected material should be resistant to the harsh environment encountered in space. In addition, the selected material should be inelastic and as thin as possible in light of structural design safety margins. One suitable material for reflector sheet 35 is KAPTON® film coated or metalized with a thin layer of aluminum or silver. KAPTON® is a registered trademark of DUPONT® for its brand of polyimide polymer. Preferably, the KAPTON® film is about 0.0005 to 0.0020 inches thick, more preferably, the KAPTON® film is about 0.0010 inches thick.

If silver is used, preferably one or more layers of a glassy ceramic coating are provided over the silver to provide protection against tarnish and moisture. The glassy ceramic may be $Al_2O_3$ or $SiO_x$ or other coatings such as are already known and used in the art. In addition, as will be readily appreciated by those skilled in the art, an adhesion layer, such as chromium, is preferably applied to the KAPTON®, or other plastic film substrate, prior to metalizing the surface of the substrate with aluminum or silver (or other reflective metal coating) to improve adhesion between the plastic substrate and the coating.

Erector 40 comprises a biasing element, such as a leaf spring, which causes the reflector 25 to self-deploy to its operational configuration when external forces are removed. Considering that a solar panel 10 according to the present invention may be stowed for an extended period prior to launch and subsequent deployment of the solar panel, erector 40 should be capable of being stowed in its collapsed configuration for an extended period of time, yet retain its biasing ability so that, in the absence of external forces, the erector 40 erects the reflector 25 to its deployed and operational configuration.

In the embodiment shown in FIGS. 3 through 7, erector 40 comprises a spring formed from a metal sheet, such as spring steel or titanium. The metal sheet is folded or creased to form a dihedral edge 41 between a base arm 42 and an erector arm 43. Free edge 45 of erector arm 43 acts as a fold-forming edge over which reflector sheet 35 is bent in the erect configuration to form dihedral edge 38.

Figure 20:
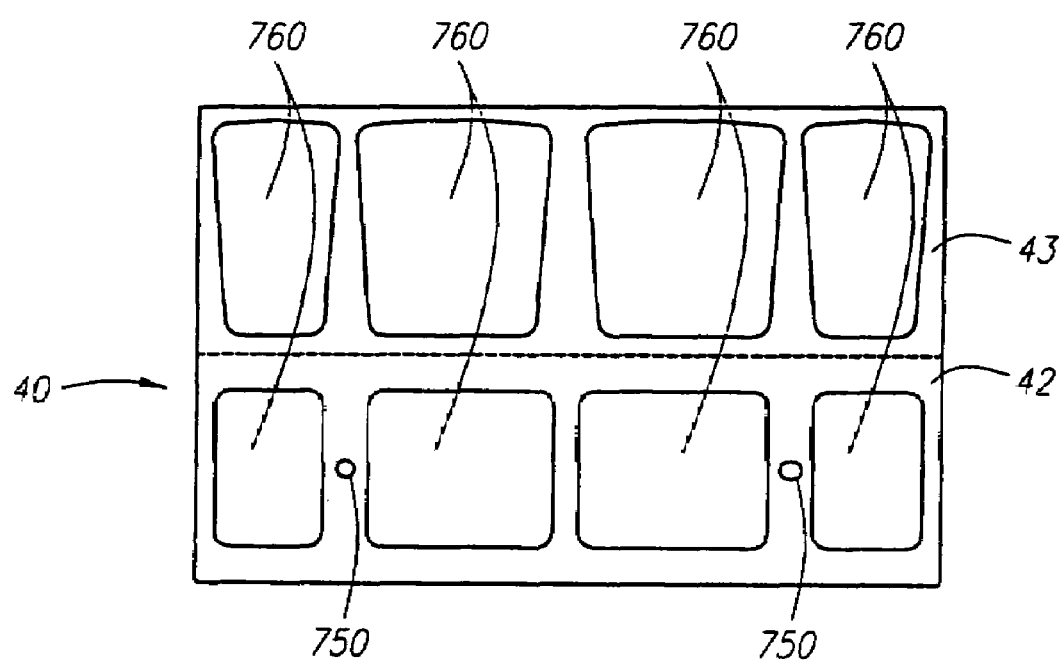
FIG. 20 is a plan view of a sheet of metal from which an erector according to an embodiment of the present invention may be fabricated.

Preferably, the thickness of the metal sheet used to form erector 40 is kept to a minimum to reduce the weight of solar panel 10. Spring metals having a thickness of about 0.002 inches have been found to satisfy both structural and weight considerations. As illustrated in FIG. 20, however, holes 760 are preferably formed in the metal sheet stock used to form erector 40 to further reduce weight.

Although spring steel or titanium are preferred materials for fabricating erector 40, those skilled in the art will appreciate that a wide variety of other materials may also be used to fabricate erector 40. The yield strength of the material used to construct erector 40, however, should be sufficient so that the yield strength of the material is not exceeded when erector arm 43 is pivoted between its deployed and collapsed positions about dihedral edge 41. Furthermore, the material used for erector 40 should not relax over time so that the spring qualities of the erector are unacceptably diminished.

Figure 3:
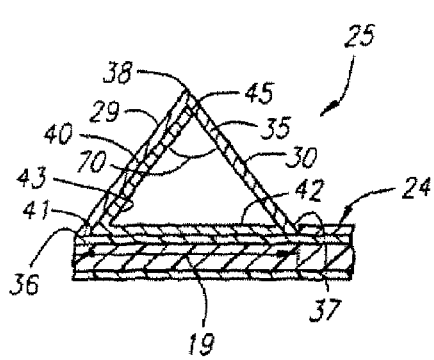
FIG. 3 is a cross-sectional view of a collapsible, self-deploying reflector according to one embodiment of the present invention in its erect configuration.

When mounted, erector 40 extends generally parallel to the rows 13 of solar cells 24. The base arm 42 may be mounted to the solar panel 10 by attaching base arm 42 to the base 11. The erector arm 43 is inherently biased due to the springiness of the material used to fabricate erector 40 toward the erected shape, or deployed configuration, as shown in FIG. 3. Actually, if not restrained by the reflector sheet 35, the erector 40 should tend to open even farther than illustrated so that a constant tension is applied to reflector sheet 35.

Figure 4:
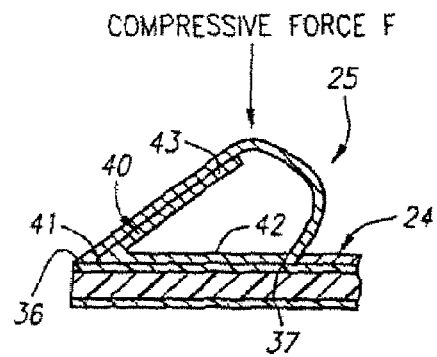
FIG. 4 is a cross-sectional view showing the reflector of FIG. 3 partially compressed.
Figure 5:
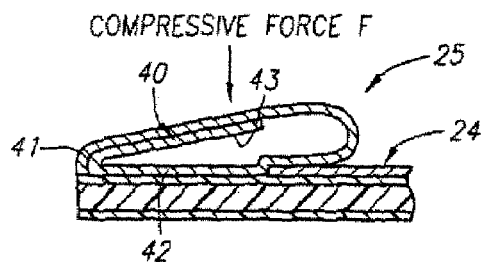
FIG. 5 is a cross-sectional view showing the reflector of FIG. 3 in its fully stowed, or collapsed, configuration.

FIG. 4 shows the reflector 25 in a partially stowed intermediate configuration. The reflector 25 will have been pressed down by some external force F, causing the erector arm 43 to collapse towards the base of the solar panel 10. As can be seen, the flexible reflector sheet 35 will have some slack. FIG. 5 shows the reflector 25 in its stowed, or collapsed, configuration. The slack in reflector sheet 35 will tend to overlay adjacent solar cells 24. This does not pose a problem, however, as the collapsed reflector sheet 35 extending onto the adjacent cells does no harm to them.

It is contemplated that an array 800 of the present invention would comprise several of the solar panels 10 of the present invention capable of being folded up for stowage, and that some or all of the reflectors 25 on the array 800 will be in their collapsed position when the array 800 is folded up for stowage. In the embodiment shown in FIGS. 6 and 7, the reflectors 25A on solar panel 10A collapse against reflectors 25B on solar panel 10B as solar panels 10A and 10B are folded up for stowage. Other aspects of stowage and deployment of arrays of the present invention are discussed, infra.

Although erector 40 of the present embodiment comprises a leaf spring having a base arm integrally attached to an erector arm, it will be readily apparent to those skilled in the art that other types of erectors 40 may also be used to erect reflector 25. For example, the preferred erector 40 shown in FIGS. 3-7 could be replaced with an erector comprising a base arm 42, an erecting arm 43 attached to the base arm by one or more hinges or other pivot means, and a known biasing element connected between the two arms to bias the erecting arm 43 toward its erected or operational configuration. Erector 40 illustrated in FIGS. 3-7 could similarly be replaced with an erector that comprises a biasing element that axially compresses and expands in the longitudinal bisecting plane. These designs, however, require the use of multiple individual components to form erector 40. As a result, they tend to make the erector unnecessarily complicated. They would also tend to reduce the overall reliability of solar panel 10, while simultaneously increasing the weight of the structure.

Assuming that typical solar cells having a width of approximately 7 cm are used in constructing solar panel 10, then the typical dimensions of the reflector 25 according to the present embodiment of the invention are as follows:

| | |
|---|---|
| Width of the reflector bases: | 7 cm (3 to 10 cm) |
| Included apex angle at the tip of the reflector: | 40-65 degrees |

The preferred apex angle 70 for a reflector 25 is about 60 degrees (30 degrees half angle) when the width of the adjacent row 13 and of the reflector base are about equal. The result of this configuration will be that energy incident on the reflecting sides 29, 30 of the reflector 25 will be reflected over the entire surface of adjacent rows 13 of solar cells 24. A somewhat larger apex angle 70 may direct some energy at the edge beyond the row 13 of solar cells 24. In contrast, a somewhat smaller angle will reflect incident energy that is normal to the base 11 over less than the full width of the adjacent solar cells 24. As a result, this arrangement provides more tolerance for off-pointing; that is, when the solar panel is not precisely normal to the incident energy.

The reflectors 25 of this embodiment can be assembled and attached to the panel by a variety of methods. In one method, the erector 40 is attached at center spacing 16 or edge spacing 19 to the base 11 by fastening means such as the fastener 752 shown in FIG. 19, discussed infra. The lengthwise edges 36, 37 of reflector sheet 35 are then attached to the base 11 at the edges of the respective spacing 16 or 19 using an adhesive strip or other fastening means. The width of the reflector sheet 35 is approximately twice the desired length of its legs, or reflecting sides 29, 30. Thus, when deployed, the reflector 25 has an approximate cross-sectional shape of an isosceles triangle.

Alternatively, the reflector 25 can be formed as a modular unit by wrapping reflector sheet 35 around erector 40 and attaching the lengthwise edges 36, 37 of reflector sheet 35 to the bottom of the base arm 42 using suitable adhesive means such as double-sided adhesive tape. The width of the reflector sheet 35 for this embodiment is larger than twice the desired length of its legs, or reflecting sides 29, 30 to allow the reflector sheet 35 to be wrapped under and attached to the erector 40. This modular reflector 25 can then be attached to the base 11 by fastening means such as the fastener 752 shown in FIG. 19, discussed infra.

In yet another alternative, the reflector 25 is formed as a modular unit by forming a tube with reflector sheet 35 by attaching precut lengthwise edges 36, 37 of reflector sheet 35 together with appropriate adhesive means such as adhesive tape. The erector 40 is then inserted into the tube. Preferably, the reflector tube is attached to the bottom of the base arm 42 using suitable adhesive means such as double-sided adhesive tape. This modular reflector 25 can then be attached to the base 11 by fastening means such as the fastener 752 shown in FIG. 19, discussed infra.

The reflectors 25 can be connected to the panel by a variety of means that will be apparent to those skilled in the art. One method of connecting a reflector 25 is now described in connection with FIG. 19. Although this method is described in connection with a reflector 25 of the type shown in FIGS. 3-7, it can similarly be used to attach other reflectors 25 as well, including the two modular reflectors 25 discussed, supra.

Figure 19:
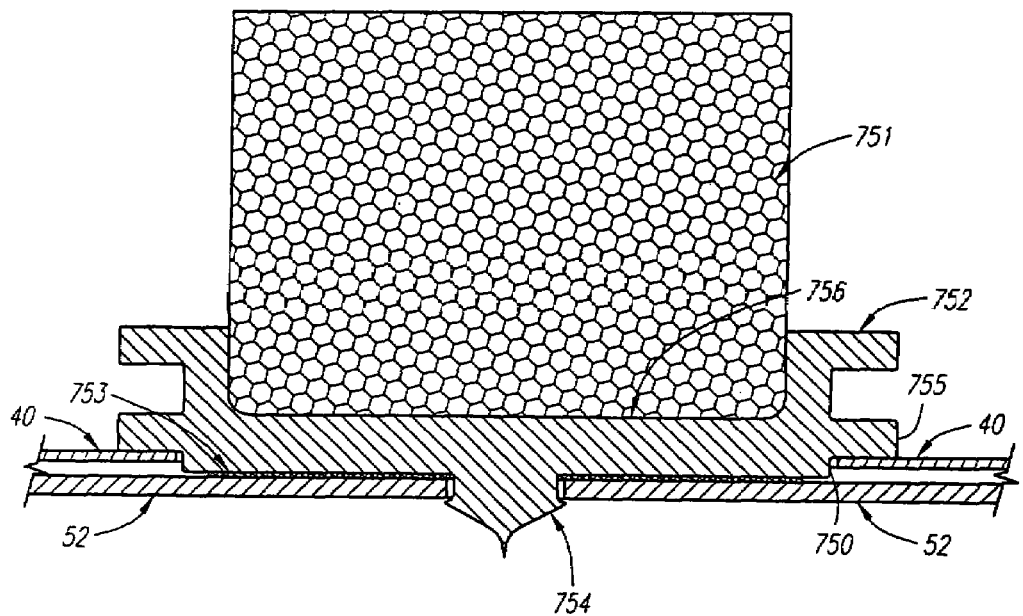
FIG. 19 is a cross-sectional view of a preferred fastener for fastening reflectors according to the present invention to the face sheet of a solar panel.

As can be seen from FIG. 19, the erector 40 can be connected to the front face sheet 52 of the base 11 (see FIG. 1A) using a fastener 752. To accomplish this, a portion of the fastener 752 extends through through-hole 750 in the erector 40. Through-hole 750 is best seen in FIG. 20. The portion of fastener 752 extending through through-hole 750 is preferably attached to the front face sheet 52 of the base 11 using an adhesive tape or other adhesive means 753. The fastener 752 has a flange 755 that is in compressive contact with the portion of erector 40 immediately surrounding the through-hole 750. The fastener 752 also preferably includes a locking nub 754 to mechanically fasten the reflector 25 to base 11. Locking nub 754 interlocks with predrilled holes provided in the front face sheet 52 to facilitate accurate reflector location on the panel. Locking nub 754 also provides a redundant mechanical means of fastening the fastener 752 to front face sheet 52. As a result, fastener 752 provides an accurate and reliable means for attaching reflectors 25 to base 11.

Figure 17:
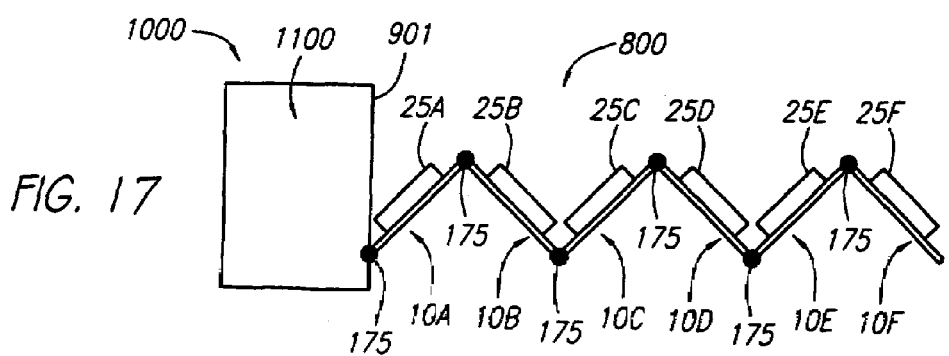
FIG. 17 is a side view of a preferred embodiment of a spacecraft according to the present invention with a solar array in a position of partial deployment.

Optional foam panel spacer 751 is preferably attached in a recess 756 provided in the top surface of fastener 752. The foam panel spacer 751 provides panel-to-panel damping and, hence, added protection for the components of solar panel 10, such as when the solar panel is one of several solar panels 10 provided in a collapsible array 800 (as best seen in FIG. 17) and the array is collapsed to its stowed position for launch. The ability to place the protective foam panel spacer 751 under the reflector in this fashion is an advantage of the present invention because it provides added protection to the solar panel 10, as well as the array 800, without further reducing the amount of active area of solar cells. It should also be noted that the reflectors themselves will reduce panel vibration during launch because they provide some resistance between the panels.

The fastener 752 is preferably constructed of DELRIN® plastic; the adhesive means 753 is preferably KAPTON® tape or RTV silicone; and the foam panel spacer 751 is preferably an open-cell silicone foam. DELRIN® is the registered trademark of DUPONT® for its brand of acetal resin polymer, also commonly referred to as polyoxymethylene.

Figure 12:
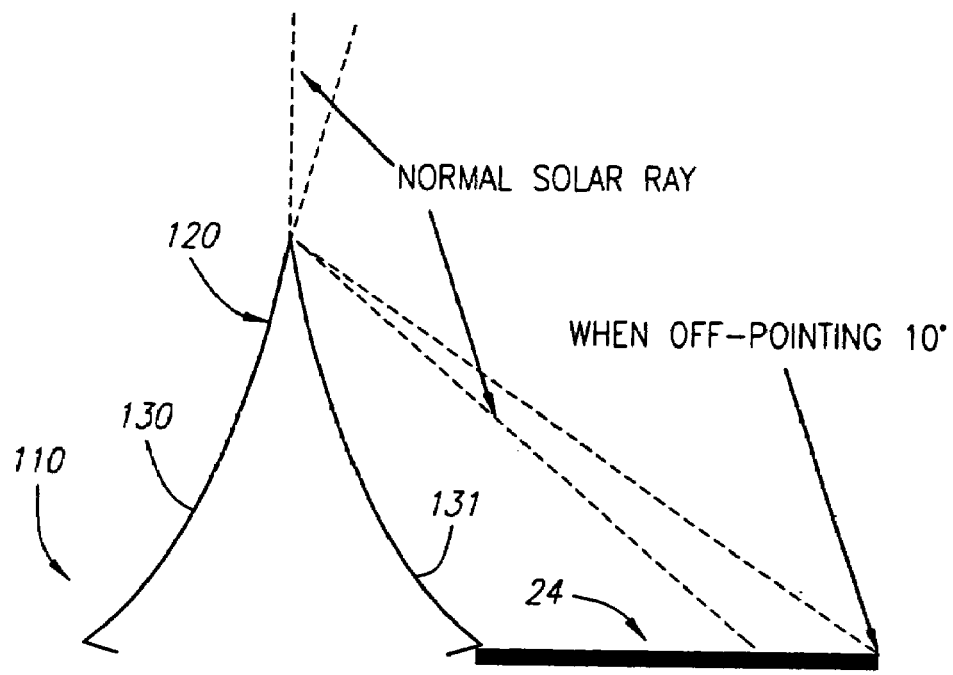
FIG. 12 is an end view of an alternative embodiment of a collapsible, self-deploying reflector according to the present invention.
Figure 13:
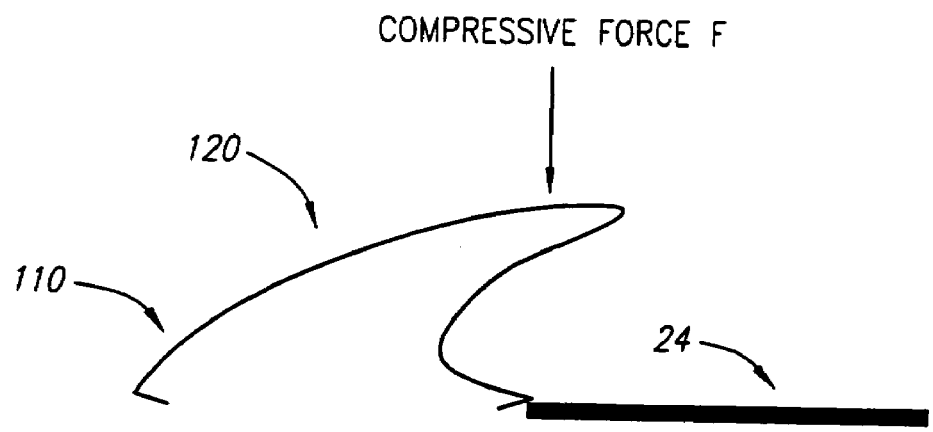
FIG. 13 is an end view of the collapsible, self-deploying reflector shown in FIG. 12 being compressed towards its collapsed, or stowed, configuration.

An alternative embodiment of a collapsible, self-deploying reflector that may be used in connection with the solar panels 10 of the present invention is shown in FIGS. 12 and 13. FIG. 12 shows a reflector 110 in its deployed, or erect, configuration. The reflector 110 comprises first and second reflecting sides 130, 131 that preferably are substantially symmetrically disposed about the longitudinal bisecting plane 26 that is perpendicular to base 11 and is parallel to and coincident with the longitudinal axis of the reflector 110 when the reflector 110 is in a deployed position. The reflecting sides 130, 131 preferably comprise a concave curved shape as shown in the present embodiment. As shown in FIG. 12, this design is particularly useful where it is anticipated that off-pointing will occur from time to time with the solar panel 10.

Reflector 110 of the present embodiment is preferably made from a very thin metal sheet 120 having a reflective surface. Reflector 110 may be attached to the base 11 of the solar panel 10 using fastener 752 as described above.

Reflector 110 is formed by creasing metal sheet 120 along its length and performing the concave curved reflecting sides 130, 131. Alternatively, reflector 110 may be molded from a suitable plastic material. By selecting a material with appropriate spring characteristics, reflector 110 will be inherently biased to erect itself to its operational and deployed configuration. Because the metal sheet 120 is itself biased to deploy and form the reflector's operational configuration, no separate erector is needed.

FIG. 13 shows reflector 110 in its collapsed, or stowed, configuration. As shown in FIG. 13, reflectors 110 of this embodiment may collapse much like a breaking wave upon exertion of a compressive force F. Upon removal of this compressive force F, the reflector 110 will erect itself to its operational and deployed configuration, as shown in FIG. 12.

A distinct advantage of the present embodiment is that the sheet metal 120 can be preformed so that the reflector 110 takes on a predetermined shape when in it is deployed and in its operational configuration. This provides the designer some additional flexibility and can be used to reduce the panel's sensitivity to off-pointing. This is illustrated by the arrows in FIG. 12, which demonstrate how by curving the reflecting sides 130, 131 of reflector 110 inward, the sensitivity to off-pointing can be reduced.

Preferably, reflector 110 is constructed from a sheet of titanium metal having a thickness of about 0.0015 inches. The width of the base of the reflector 110 is preferably about the same as the width of the row 13 of solar cells. Thus, assuming that solar cells having a width of 7 cm are used to construct rows 13 and further assuming that the rows are only one solar cell in width, suitable dimensions of a reflector 110 or this embodiment are as follows:

| Width of the reflector bases: | 7 cm |
| Included apex angle at the tip of the reflector: | 40-65 degrees |

Figure 9A:
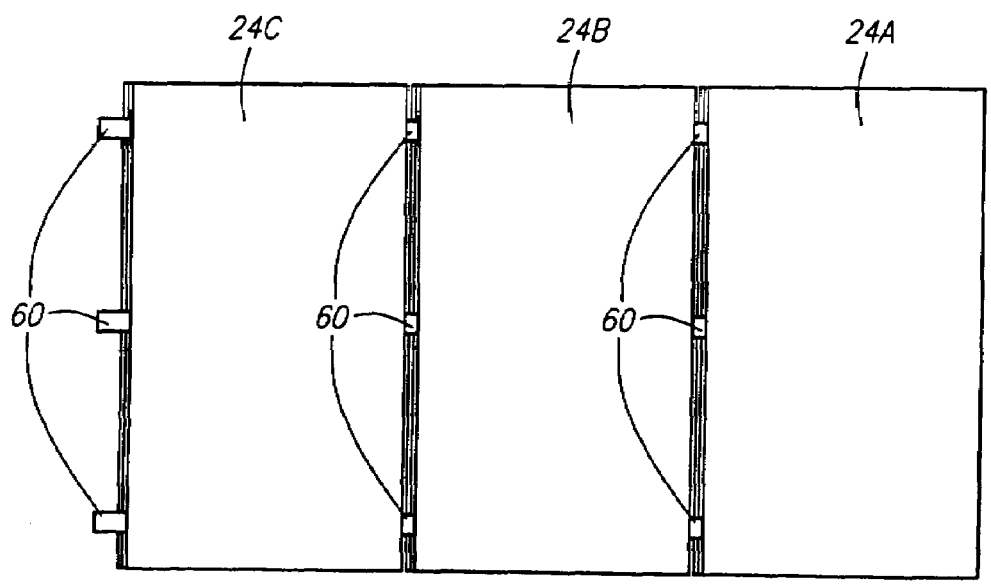
FIG. 9A is a plan view of three solar cells connected in series.
Figure 9B:
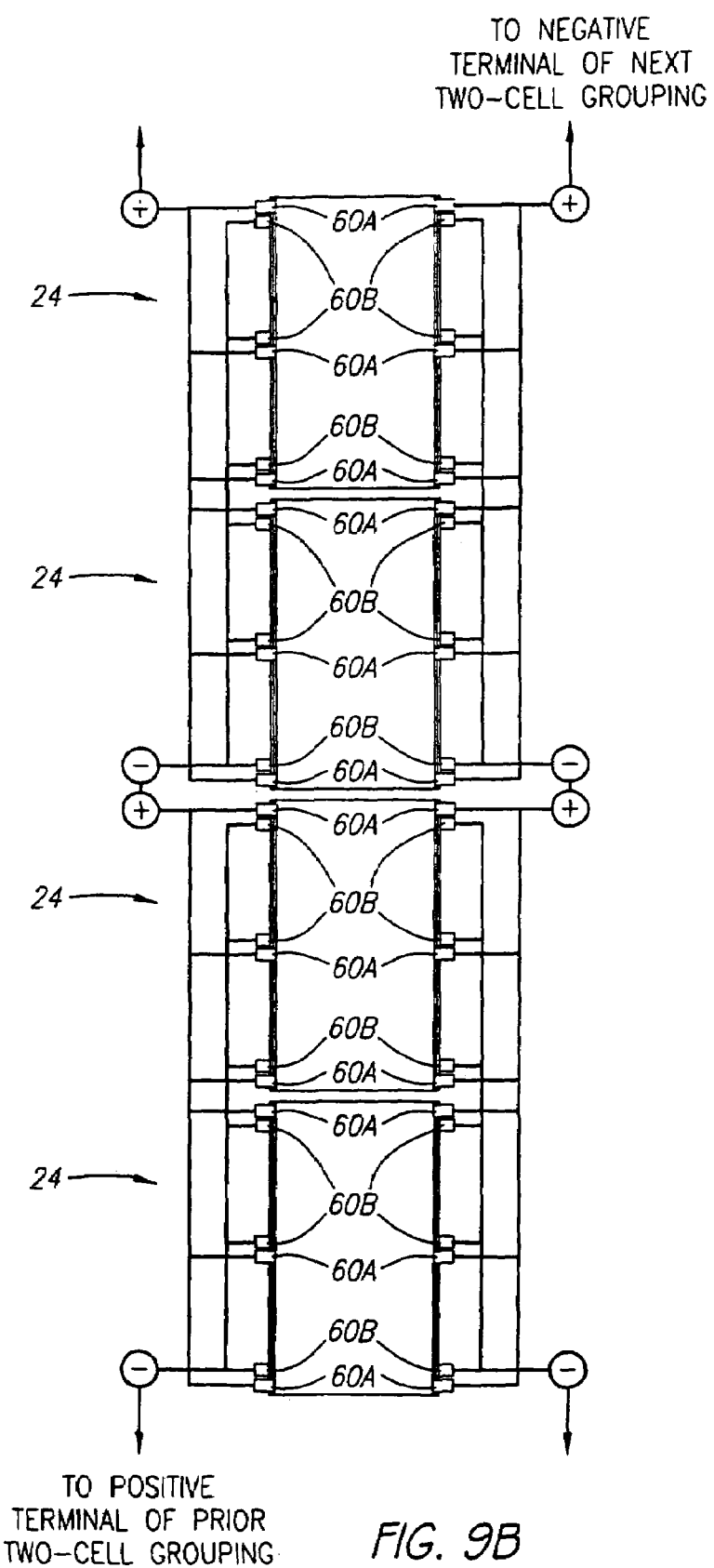
FIG. 9B is a fragmentary plan view of a row of solar cells with dual ohmics, with sub-groupings of cells being connected in parallel, with each such sub-grouping then being connected in series. In this view, the parallel connected sub-groupings comprise two solar cells.
Figure 9C:
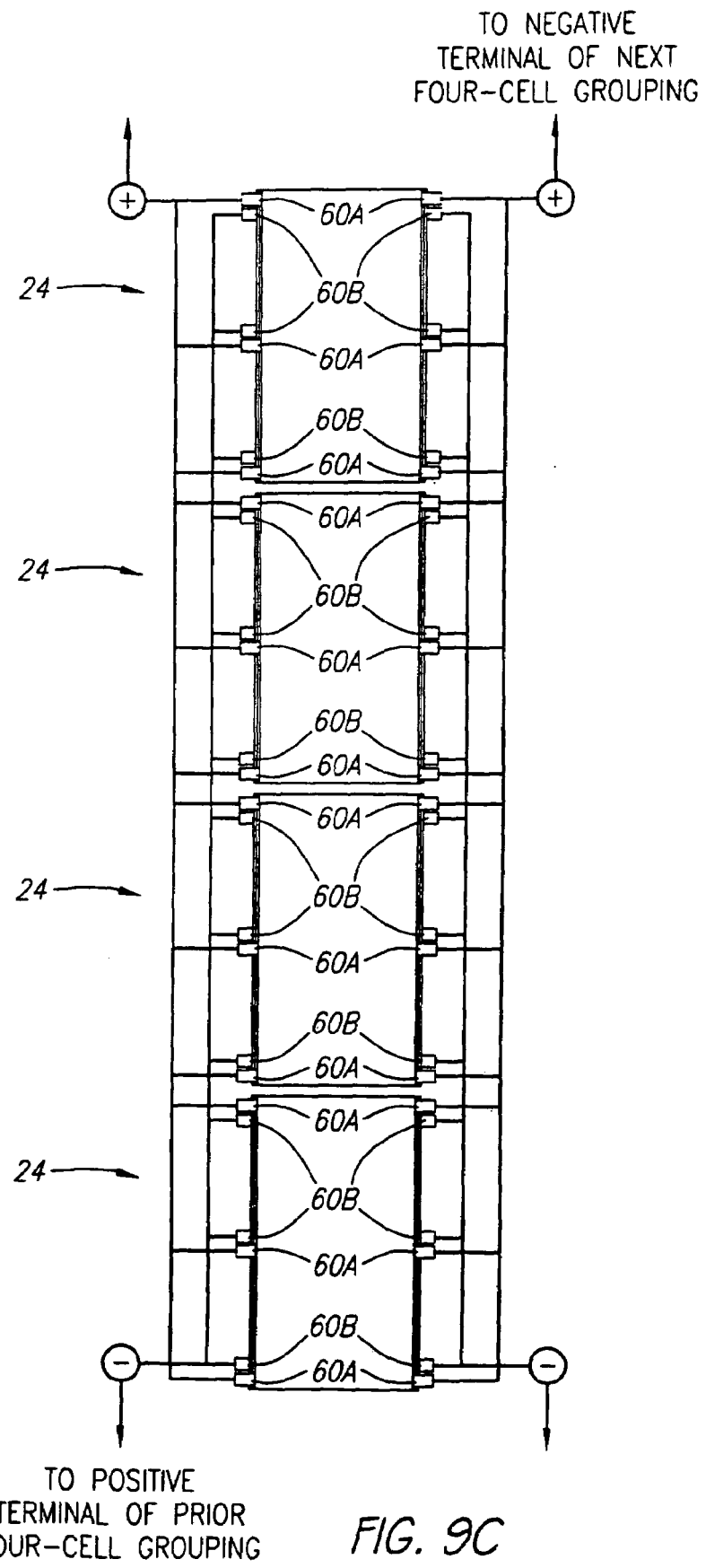
FIG. 9C is a fragmentary plan view of a row of solar cells with dual ohmics, with sub-groupings of cells being connected in parallel, with each such sub-grouping then being connected in series. In this view, the parallel connected sub-groupings comprise four solar cells.

If, as shown in FIGS. 9B and 9C, discussed infra, 7×3.5 cm cells with dual ohmics are used instead of traditional 3.5×7 cm cells, then the rows of solar cells would be only 3.5 cm in width, so the width of the reflector bases would have to be adjusted accordingly.

To improve the reflectivity of reflecting sides 130, 131, metal sheet 120 may be polished prior to forming reflector 110. Reflecting sides 130, 131 are also preferably provided with a metal coating of a metal having a higher reflectivity than titanium, such as aluminum or silver. These metals may be coated onto the titanium substrate using a variety of techniques well known in the art, including plating and sputtering. If silver is used as a reflective metal coating, preferably one or more layers of a glassy ceramic coating are provided over the silver to provide protection against tarnish and moisture. In addition, as will be readily appreciated by those skilled in the art, an adhesion layer, such as chromium, is preferably applied to the titanium, or other substrate used to form reflector 110, prior to coating the surface of the substrate with aluminum or silver (or other reflective metal coating) to improve adhesion between the substrate and the coating.

Those skilled in the art will understand that the reflector of the present invention can comprise any shape capable of reflecting incident radiation from the reflector onto the rows of cells. For instance, the reflectors may be trapezoidal in shape, preferably with similar angles between the sides and the base of the trapezoid. As noted above, the two reflecting sides of the reflector need not be planar. Use of non-planar designs is particularly useful where it is desired to provide resistance to off-pointing. For example, in the embodiment described in FIGS. 12 and 13, the reflecting sides have a concave curved shape, with the upper section of each reflecting side 130, 131 being steeper than the lower section. Similarly, the reflecting sides of a reflector could be stepped or bent; that is, each reflecting side could comprise two or more reflecting portions joined together at an angle. For instance, the upper portion of each reflecting side could be steeper than the lower portion, which would allow for a greater tolerance for off-pointing.

The embodiments of the solar panels and reflectors according to the present invention have many advantages. One advantage is that the reflectors are capable of being collapsed when stowed, thus maintaining the volume of a typical solar panel array when stowed.

Another advantage is a reduction in the overheating problems caused by prior solar concentrators. A prior art "full panel reflector system" as shown in FIG. 8, comprises a solar panel 300 with large reflectors 100 mounted on its edges and a plurality of rows of solar cells 200 disposed on its face. In such full panel reflector systems, the solar cells 200 in the middle of the solar panel 300 tend to experience extreme heating, causing those cells to under-perform. These overheating problems are generated in part because the collective area of the solar panel 300 is much larger than the panel's radiative area. It is estimated that the solar cells in such prior art solar panels will operate 50-70° C. higher than a standard prior art solar panel without any solar concentrators.

In contrast, the temperature of the solar cells 24 on a solar panel 10 according to the present invention is moderated to a level much closer to standard solar panels without concentrators because the collection area is approximately equal to the radiative area. Also, the areas under the reflectors will tend to act as heat sinks that pull heat from adjacent rows of solar cells. The alternating arrangement of rows of solar cells and reflectors also tends to moderate the temperature of the cells better than solar panels that include one or two large reflectors disposed at the panel's edges, such as the panel shown in FIG. 8. As can be seen in the embodiment depicted in FIGS. 1, 1A, and 2, the temperature of the solar cells 24 will be moderated because each row 13 of soalr cells 24 is provided with a spacing 16 or 19 on each of its sides. These spacings act as heat sinks to help draw the heat away from the rows of solar cells, thus minimizing the loss of cell efficiency due to temperature increases that was typically encountered when prior art solar concentrators were used in combination with solar panels.

Analysis tends to bear this out. For example, analysis was performed on a typical solar panel 10 according to the present invention as follows: The reflectors 25 were dimensioned and arranged to provide a solar concentration of approximately 2.0. The reflectance of the aluminum metalized Kapton™ film used for reflector sheet 35 was 0.88. The erector was made from 2 mil titanium. The face sheets comprised XN70A comprising three 2.5 mil plies of fiber oriented at 60°, 0°, and −60°, respectively, so that the total thickness of the face sheet was 0.0075 inches. The core comprised a 5051 Al honeycomb core having a thickness of 0.625 inches, a ribbon thickness of 0.0007 inches and a honeycomb cell size of 0.1875 inches. The solar cells comprised three junction germanium cells having an optical efficiency of 19%.

Figure 14:
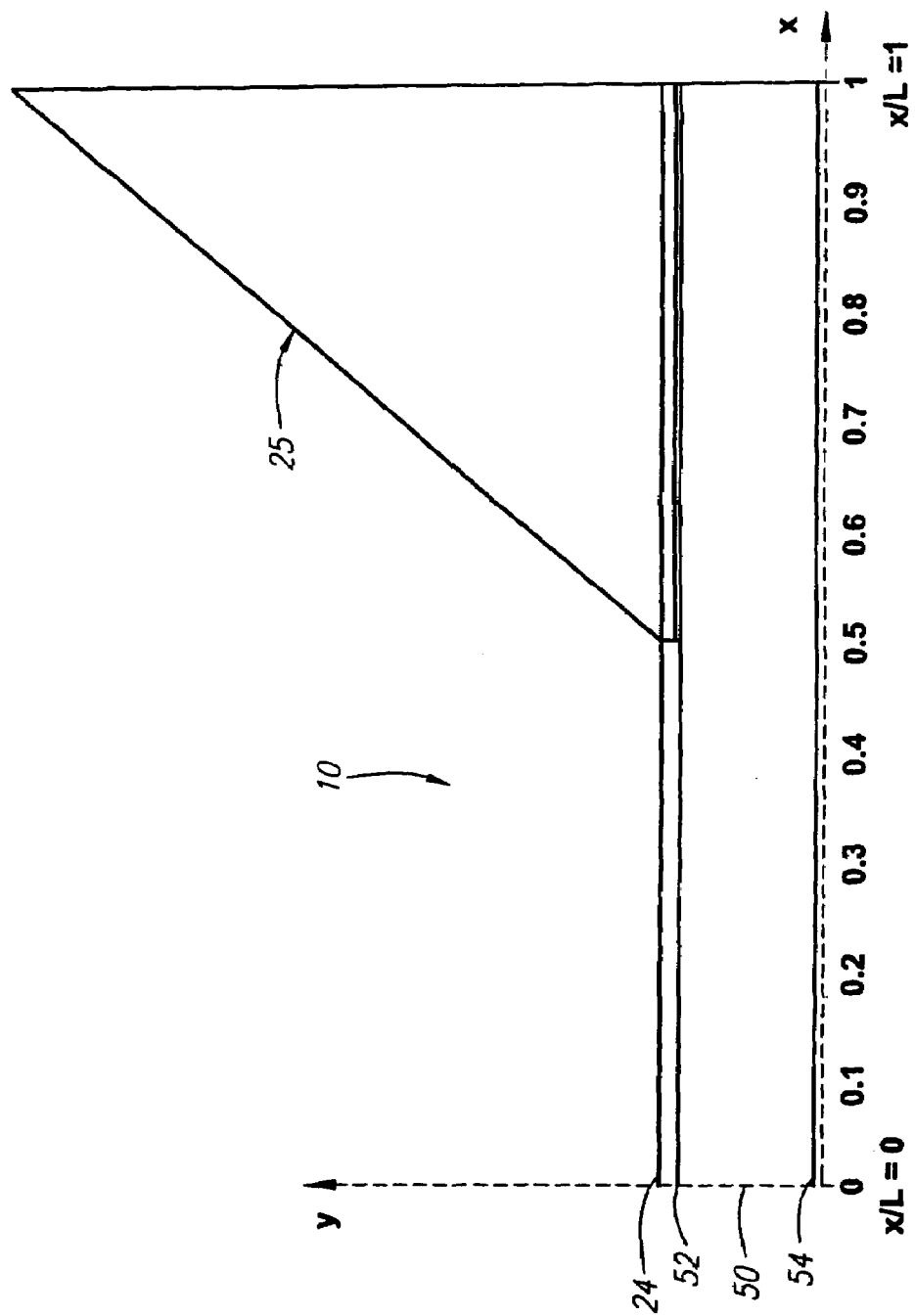
FIG. 14 is a schematic cross section of a portion of a solar panel according to the present invention.
Figure 15:
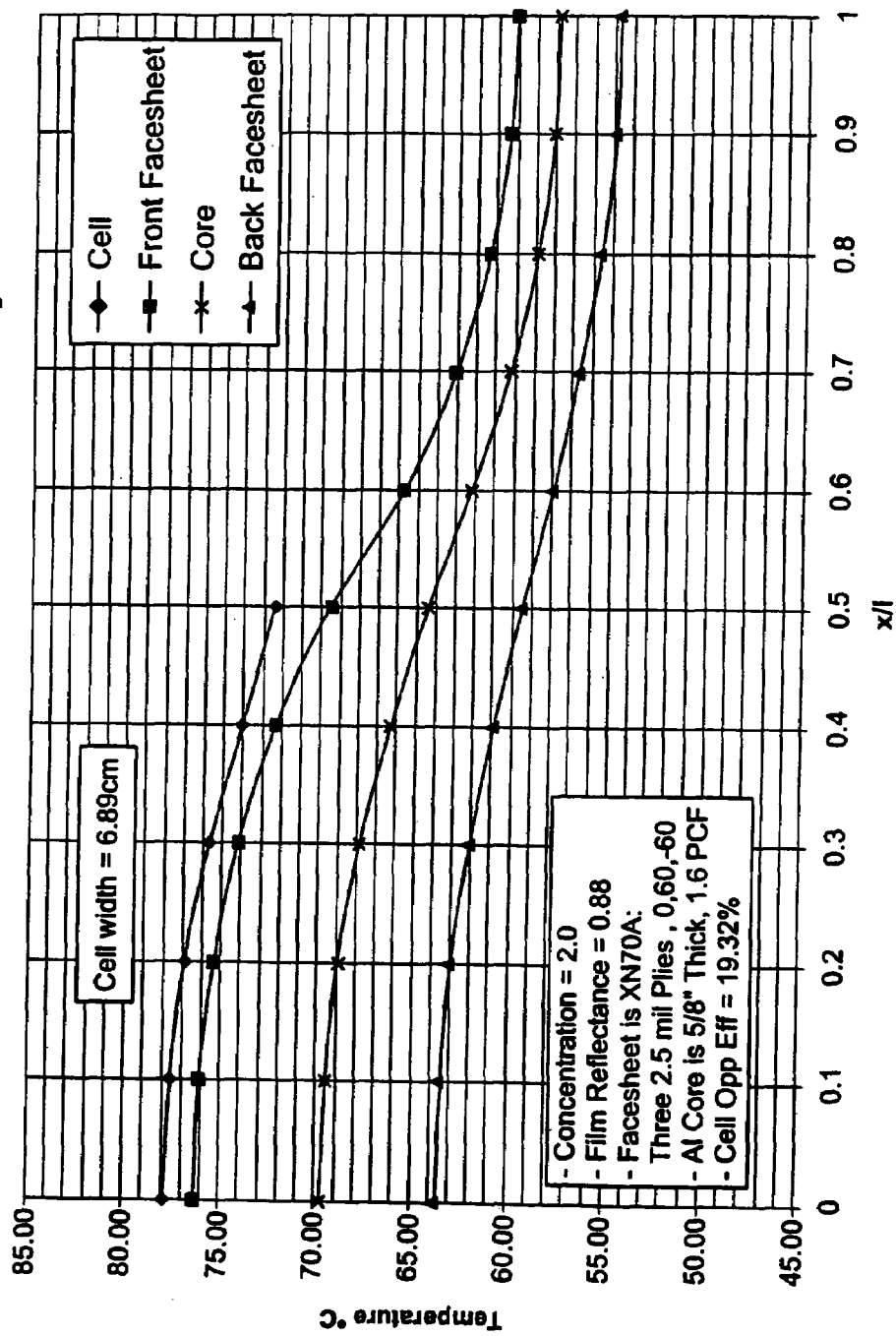
FIG. 15 is a graph showing the steady-state temperature profile for the embodiment schematically shown in FIG. 14.

FIG. 14 shows a schematic cross section of a portion of the solar panel 10 that was analyzed. Due to symmetry, only half of solar cell 24 and half of the reflector 25 are shown. FIG. 15 shows the corresponding steady state thermal analysis for the portion of the solar panel 10 reflected in FIG. 14. As can be seen, the panel temperature peaks in the middle of the cell (x/L=0), and is coolest under the center of the reflector 25 (x/L=1). Importantly, the temperature of the solar cell 24 is relatively moderate, ranging from approximately 72 to 78° C. As a result, inefficiencies due to heating are minimized with the solar panel 10 according to the present invention.

In comparison, the temperature of the cells in the center of the solar panel shown in FIG. 8 are believed to be as high as 130° C. The performance of known solar cells is degraded significantly at this temperature. As a result, standard calculations indicate that the present invention can be employed to achieve power advantages on the order of 10 percent or more over the prior art configuration shown in FIG. 8.

Another advantage of certain embodiments of the present invention is that, in comparison to full panel reflector systems, the effects of distortions in the reflectors are minimized because the reflectors illuminate only the adjacent rows of solar cells rather than the entire panel.

Another advantage of using the reflectors 25 of the present invention is that they enable a designer to use alternative electrical connections among the solar cells 24 within a row 13. All spacecraft require a certain voltage and a certain electrical current to run their operating systems. Because voltages add in series, and currents add in parallel, a combination of series and parallel connections have been used to connect the various rows of solar cells on the solar panels making up a spacecraft's solar array.

Solar cells 24 within a row 13 are connected in series to each other by electrical interconnect wiring and hardware (collectively referred to as "electrical interconnect wiring"). As shown in FIG. 9A, the electrical interconnect wiring typically includes the interconnects 60 of the solar cells 24, and any wiring and materials used to connect the interconnects 60 of the solar cells 24 to adjacent cells in a row 13.

A typical method of inter-connecting space solar cells is shown in FIG. 9A. As can be seen, each solar cell 24A, 24B, 24C has three positive interconnects 60 which join to and extend from the front face of the solar cell (actually, these interconnects 60 could be either positive or negative, but have been designated positive for the sake of clarity). The back side of the solar cells 24A, 24B, 24C is metallic and constitutes the negative terminal of the solar cells 24A, 24B, 24C. As shown in FIG. 9A, the positive interconnects 60 from one cell are tucked under the adjacent cell in the row, thereby contacting the metallic back side, or negative terminal, of the adjacent cell. Thus, the positive interconnects 60 of solar cell 24A are in electrical contact with the negative back side of cell 24B, and in this manner, the solar cells 24A, 24B, 24C are connected in series.

In known solar panels, the solar cells in any given row are all connected in this manner, in part because to connect them in any other fashion than at their adjacent edges is difficult and requires the use of space otherwise devoted to solar cells, thereby reducing the active amount of photovoltaic area. Thus, in conventional panel designs, the ability to use some types of connection schemes is limited by the absence of a convenient location to hide the electrical interconnect wiring. (It is generally considered undesirable to place electrical interconnect wiring on the surface of the solar cells 24 because it can reduce the amount of active photovoltaic area exposed to solar radiation, and hence the panel's efficiency.) Connecting the solar cells 24 of a row 13 in series in this manner does minimize obstruction of active photovoltaic area; however, it also can impair performance because the current of the entire row 13 is reduced if even one solar cell 24 on the row 13 is impaired. Similarly, if one solar cell 24 on the row 13 fails to function at all, the electrical production of the entire row 13 will be lost. As noted above, solar cells can be impaired for a variety of reasons, including cracking, over-heating, and micro-meteoroid damage.

With the solar panel 10 of the instant invention, the space under the reflectors 25 can be used to connect the solar cells 24 in alternative fashions, allowing for more flexibility in design and reliability in performance. Because the present invention allows the electrical interconnect wiring to be mostly, if not entirely, placed under the reflectors 25, alternative connection schemes can be used without reducing the amount of active photovoltaic area. Placing the electrical interconnect wiring under the reflectors 25 also may increase the reliability of the system because the wiring will be somewhat protected by the reflectors 25.

Thus, the present invention enables a cell designer to connect cells in a given row in many varied and useful connection schemes. For instance, a row 13 could contain a plurality of groups of two solar cells 24 connected in parallel, with each such two-cell group then being connected in series. Similarly, a row 13 could contain groups of three solar cells 24 connected in parallel, with each such three-cell grouping then being connected in series.

Connecting groups of soalr cells 24 in parallel can reduce the overall impact of an impaired solar cell 24 because the current of the group of solar cells 24 is not reduced to the level of the impaired solar cell 24, as is the case with solar cells 24 connected in series. Thus, the present invention can be used to facilitate a combination of parallel and series connections that can be optimized to meet both the voltage and current needs of the spacecraft. Those skilled in the art will appreciate and understand how such connection schemes can be used to minimize the effect of impaired solar cells 24 and meet the voltage and current needs of the spacecraft 1000.

Another advantage of the present invention is that it facilitates the use of solar cells 24 with dual ohmics 65. Ohmics 65 are the bars at the edge of a solar cell 24 that collect the energy generated by the solar cell 24. Energy generated by the solar cell 24 is gathered and directed to the ohmics 65 by gridlines (not shown), which are thin metalized lines on the surface of the cell that run perpendicular to the ohmics. Typical spacing between gridlines is 0.020 inches.

Solar cells 24 with dual ohmics 65 are shown in FIGS. 9B, 9C, 10B and 10C. As can be seen, the solar cells 24 have two ohmics 65 on opposing sides of the solar cell 24 (this is referred to as "dual ohmics"). Attached to each of the ohmics 65 are three front-side interconnects 60A. Six back-side interconnects 60B are attached to the metallic underside of the solar cell. (The exact number of front and back side interconnects depends on the desired level of reliability.) The front-side interconnects 60A constitute the positive terminal of the solar cell 24; the back-side interconnects 60B constitute the negative terminal. Although using solar cells 24 with dual ohmics 65 may enhance performance of an array, their use has previously been limited because, with known solar panels, it is difficult to connect a row 13 of solar cells 24 with dual ohmics 65 without using considerable space.

The present invention facilitates the use of solar cells 24 with dual ohmics 65 because the ohmics 65 can be placed on the sides of the solar cells 24 adjacent to the reflectors 25. Thus, the electrical interconnect wiring used to connect the dual ohmics 65, and even the ohmics 65 themselves, can be placed under the reflector or reflectors 25 adjacent to the row 13 of cells.

Dual ohmics can be connected in a variety of useful schemes. For instance, FIG. 9B shows a portion of a row 13 containing a plurality of groups of two solar cells 24 connected in parallel, with each such two-cell group then being connected in series. Similarly, FIG. 9C shows a portion of a row 13 containing a plurality of groups of four solar cells 24 connected in parallel, with each such four-cell grouping then being connected in series.

Those skilled in the art will recognize the advantages of using cells with dual ohmics 65. Solar cells 24 with dual ohmics 65 can be more reliable because both of the ohmics 65 can collect the energy generated by the solar cell 24. Dual ohmics 65 improve the performance of a solar cell by, inter alia, shortening the distance the current needs to travel to reach an ohmic, and by increasing the solar cell's crack tolerance.

Cracks 500 in a solar cell 24 can impair performance by electrically isolating a portion 400 of the solar cell 24 from an ohmic 65, which prevents the system from harvesting the energy incident on the electrically isolated portion 400. Cracks do this by severing the gridlines, which carry the current from the surface of the cell to the ohmic 65.

Figure 10A:
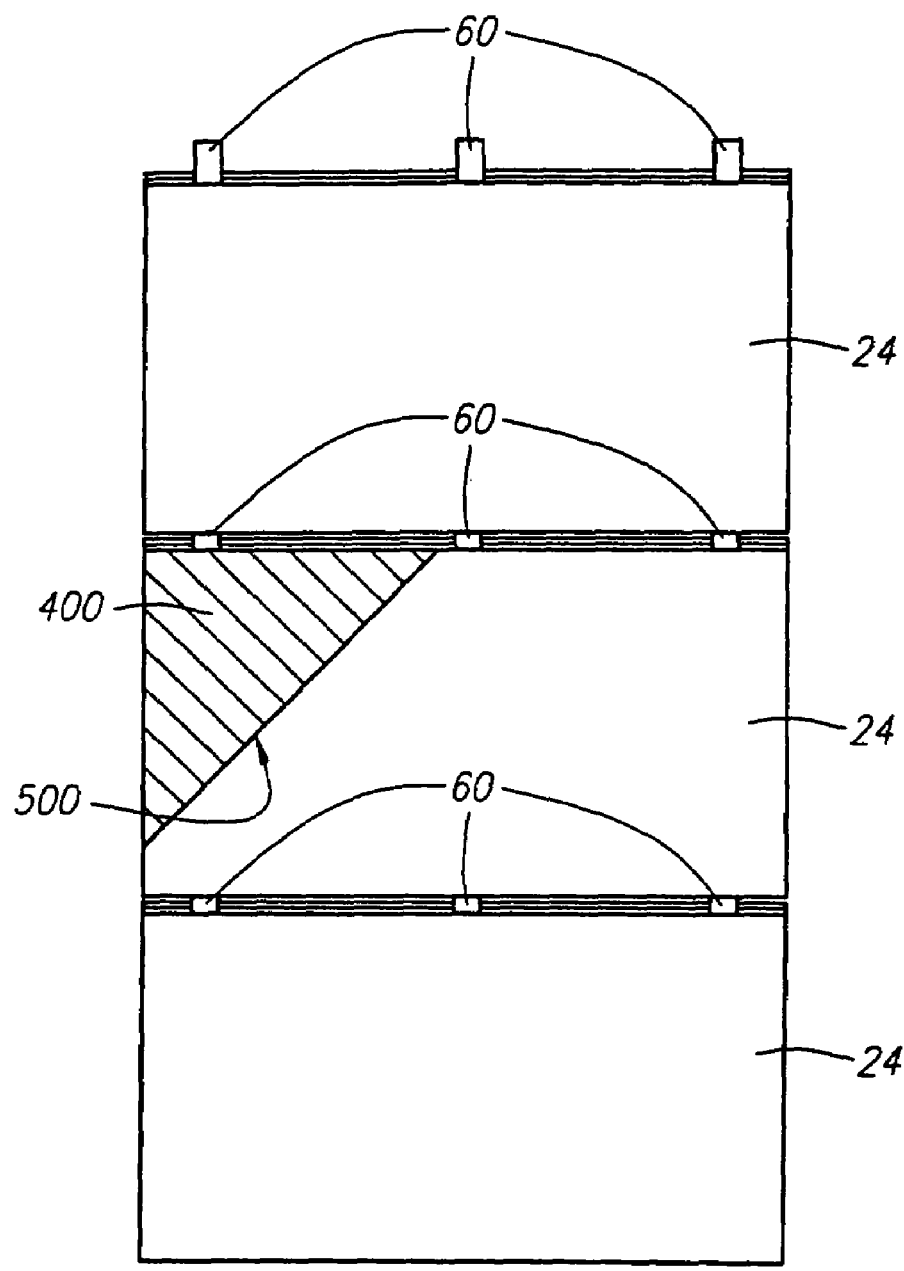
FIG. 10A is a plan view illustrating a prior art arrangement of three solar cells connected in series, with one of the solar cells being cracked.

A conventional cell layout without dual ohmics is shown in FIG. 10A. As can be seen, just one crack 500 creates a significant size isolated portion 400 because the gridlines are severed at the crack 500, which prevents the current generated on the isolated portion 400 from being carried to the cell's ohmic. Thus, the crack impairs the performance of the solar cell 24 because the energy generated on the isolated portion 400 is not harvested and, because the solar cells 24 of the row 13 are connected in series, the performance of the entire row 13 is similarly impaired.

Figure 10B:
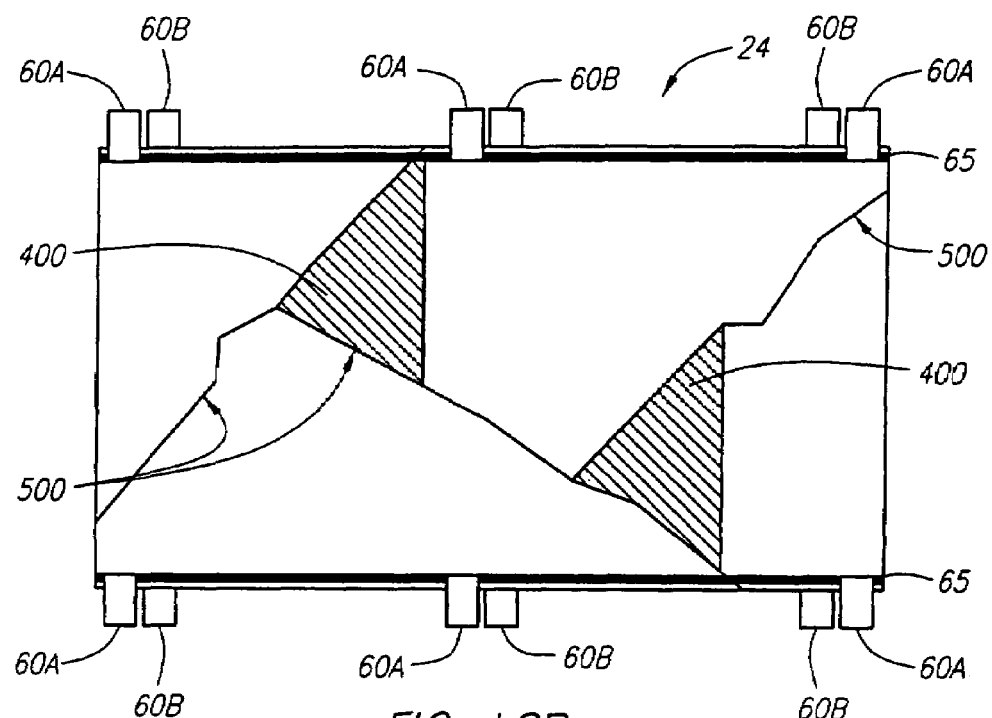
FIG. 10B is a plan view of a cracked solar cell with dual ohmics.

As shown in FIG. 10B, use of dual ohmics 65 significantly increases a cell's crack tolerance because the gridlines are connected to both ohmics 65. Thus, because current from any given location can be carried by a gridline to either ohmic 65, the three cracks 500 create only two isolated portions 400. The energy generated on these two isolated portions 400 will not be harvested because the two cracks 500 bordering the isolated portions 400 prevent current generated thereon from being carried to the ohmics 65.

Figure 10C:
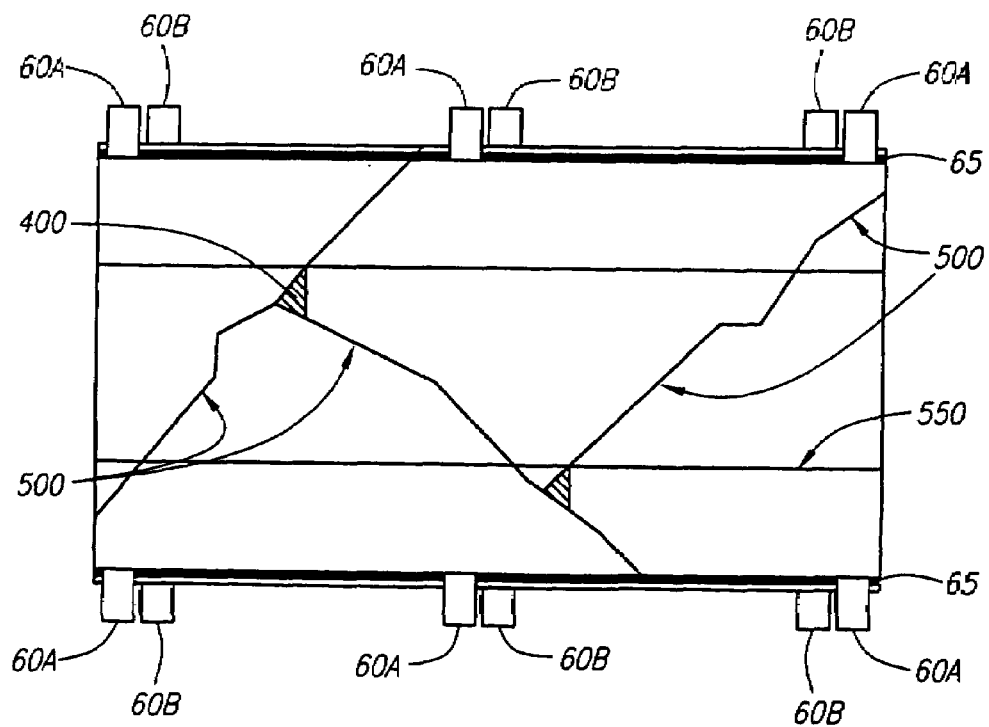
FIG. 10C is a plan view of a cracked solar cell with dual ohmics and linking gridlines on the face of the cell.

The dual ohmics 65 facilitated by certain embodiments of the present invention can also be used in conjunction with solar cells with so called "linking" gridlines 550 to further increase crack tolerance. Linking gridlines 550 are gridlines that run perpendicular to the standard gridlines on the cell. Thus, the linking gridlines 550 improve a cell's crack resistance by offering alternative routes by which current generated on the cell can be harvested and carried to the cell's ohmics 65. FIG. 10C shows the effect of three cracks 500 on a solar cell 24 with dual ohmics 65 and linking gridlines 550. As can be seen, the three cracks 500 create only a small portion 400 that is electrically isolated from an ohmic 65. Thus, it can be seen that the present invention's facilitation of dual ohmics 65, with or without linking gridlines 550, represents a considerable improvement in crack resistance over the configurations of solar cells used in known solar panels.

Figure 11A:
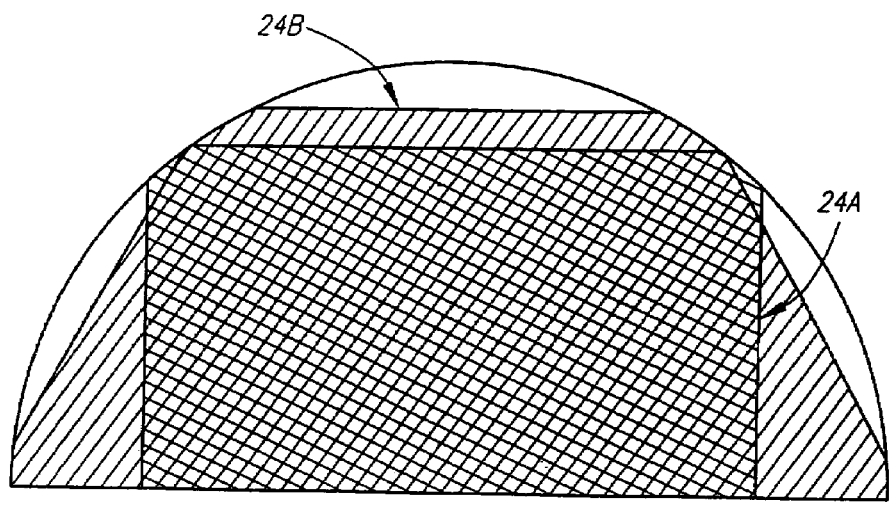
FIG. 11A is a plan view showing a trapezoidal solar cell and a typical rectangular solar cell cut from a wafer.
Figure 11B:
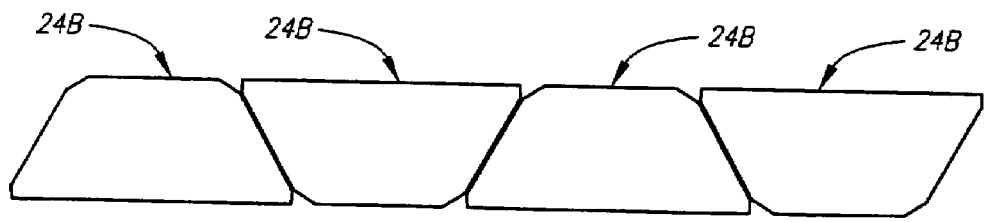
FIG. 11B is a plan view showing a row of trapezoidal solar cells.

Trapezoidal-shaped solar cells 24B can also be used advantageously in the solar panels of the present invention. Solar cells 24 are typically rectangular and are made from thin round wafers cut from a solid cylinder of grown crystal. Two rectangular solar cells 24A are typically cut from each round wafer. As shown in FIG. 11A, cutting trapezoidal solar cells 24B from the wafers rather than rectangular solar cells 24A dramatically increases the percentage of wafer usage, which can bring a significant cost saving. As shown in FIG. 11B, because the trapezoidal solar cells 24B are longer than the rectangular cells 24A traditionally used, fewer of them are used in each row. Reduction in the number of working parts is generally considered advantageous.

Square solar cells may also be used advantageously with the present invention. Currently, two 3.5×7 cm rectangular solar cells (rather than one 7×7 cm square cell) are cut from each wafer. As shown in FIG. 9A, these solar cells 24 are connected in series and are laid down so that the row is 7 cm wide (rather than 3.5 cm wide). Thus, current generated on the cell has to travel along a gridline, at most, 3.5 cm to reach the ohmic. Square cells are not currently used because they would require the current to travel too far to reach an ohmic. Square cells with dual ohmics and/or linking gridlines can, however, be used with the present invention because the presence of ohmics on both sides of the cell effectively reduces the distance that current needs to travel to reach an ohmic.

Figure 16A:
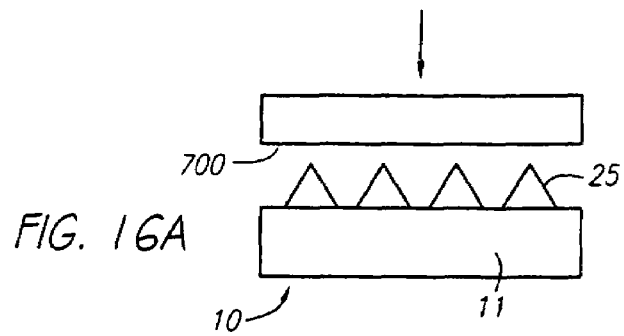
FIGS. 16A-16C are schematic illustrations of a solar panel according to the present invention being collapsed by an opposing surface.
Figure 16B:
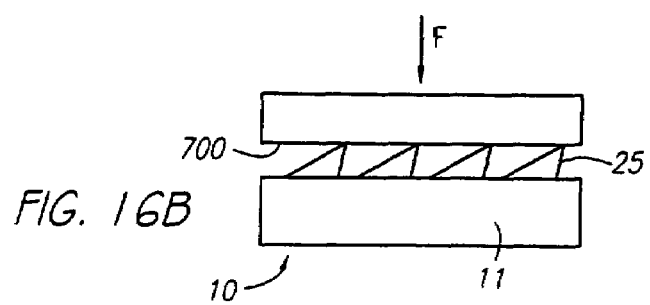
Figure 16C:
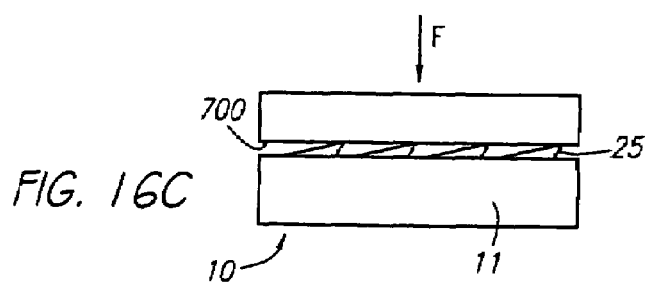

It is contemplated that an array 800 of the present invention would comprise several of the solar panels 10 of the present invention, capable of being folded up for stowage. In one embodiment, when the array is folded up for stowage, the reflectors 25 disposed on a solar panel 10 are collapsed by being forced against an opposing surface 700. An example of this is shown in FIGS. 16A-16C. One advantage of using reflectors capable of collapsing when stowed is that the volume of the array 800 is greatly reduced when stowed. As noted, watts per cubic meter is one measure of an array's efficiency. Thus, the benefits of cost and mass savings of the present invention may be realized without increasing the typical panel spacing of satellite solar panels.

As discussed previously, the reflectors 25 are preferably self-deploying so that when the opposing surface 700 is moved away, the self-deploying reflectors 25 will erect themselves to their deployed, operational configuration. The opposing surface 700 can be any surface capable of collapsing the reflectors. The opposing surface 700 will typically be a surface 901 of the spacecraft 1000, a surface of another solar panel 10 of the array 800, a reflector 25 disposed on another solar panel 10 of the array 800, some other aspect of the array, or a combination of these surfaces. Indeed, the term opposing surface 700 is meant to include any surface against which the reflectors 25 deployed on a solar panel 10 can be collapsed. It is specifically noted that the opposing surface 700 against which the reflectors 25 collapse could comprise a surface of a reflector 25 disposed on another solar panel 10 of the array 800.

Figure 6:
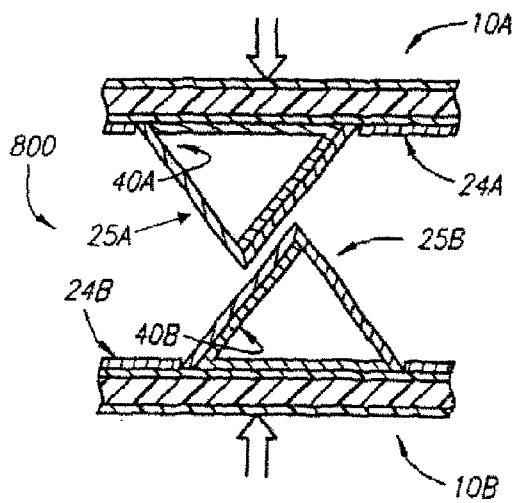
FIG. 6 is a fragmentary cross-sectional view of an array comprising two opposing solar panels before being completely stowed.
Figure 7:
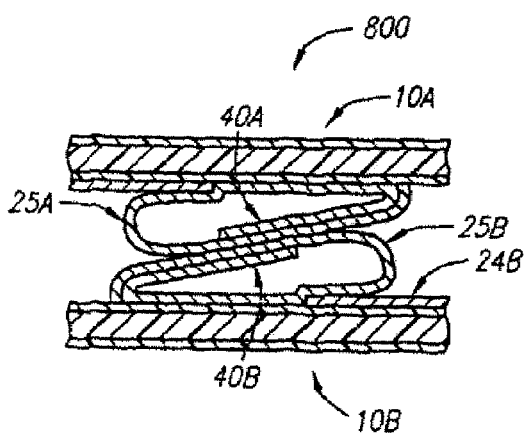
FIG. 7 is a fragmentary cross-sectional view of the solar panels of FIG. 6 brought together toward their final stowed configuration.

In a preferred embodiment, the opposing surface 700 against which the reflector 25 collapses comprises a reflector 25 disposed on the front surface 12 of another, preferably adjacent, solar panel 10 of the array 800. One example of this preferred embodiment is shown in FIGS. 6 and 7, in which two opposing solar panels 10A, 10B are brought toward each other with reflectors 25A, 25B facing each other. As can be seen, the reflectors 25A, 25B begin to collapse against each other when the two opposing solar panels 10A, 10B are brought together. The reflectors 25A, 25B are preferably offset a bit so the folding of the erectors 40A, 40B is facilitated. As shown in FIG. 7, when the opposing solar panels 10A, 10B are pressed to maximum adjacency, the erectors 40A, 40B are nearly fully folded by each other, and the thickness of the stowed two-panel array 800 is minimized. A similar arrangement can be used with the reflectors 110 shown in FIGS. 12 and 13.

Figure 18:
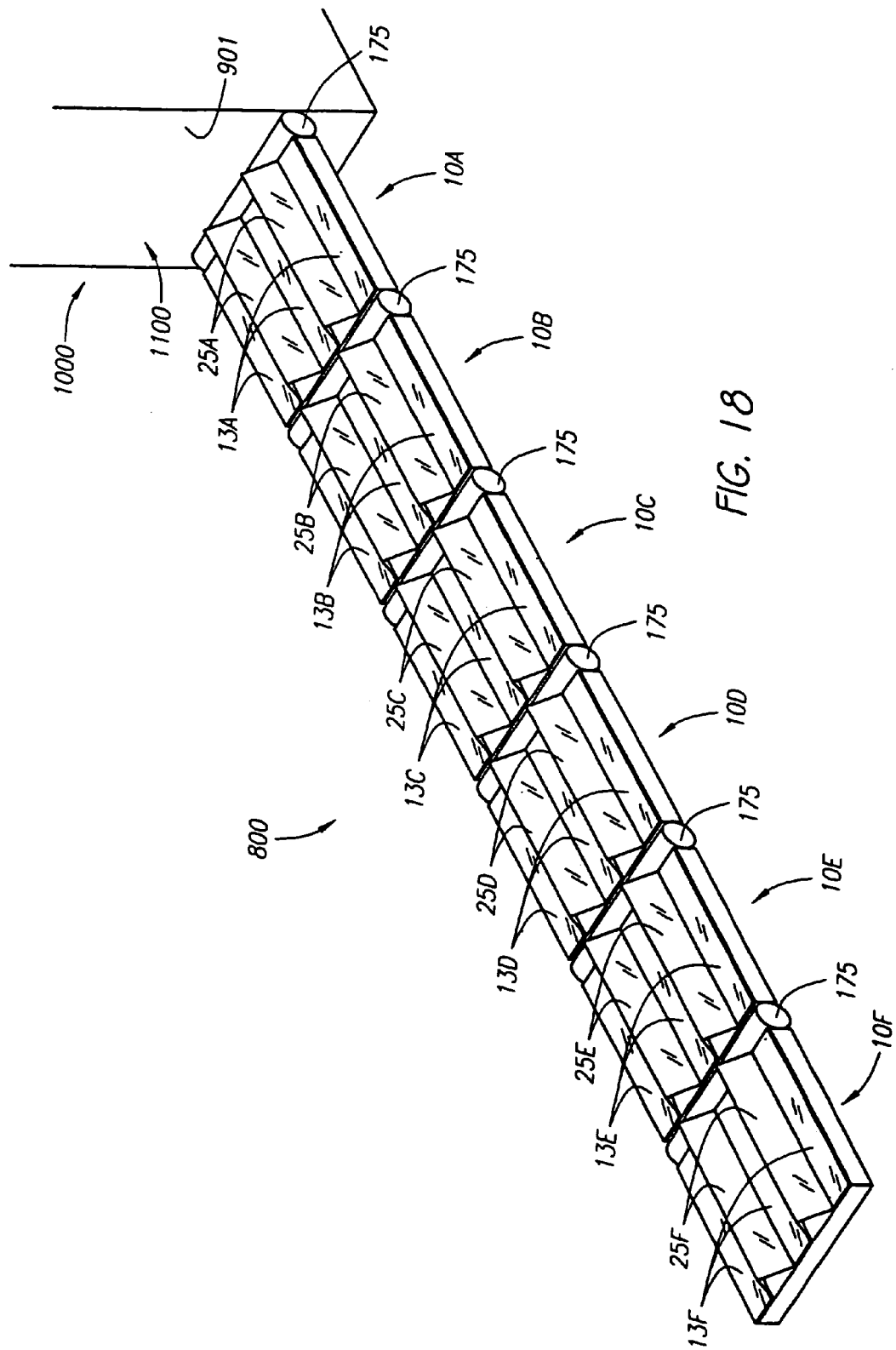
FIG. 18 is a perspective view of the spacecraft of FIG. 17 with the solar array in a position of complete deployment.

FIG. 17 shows a side perspective of a preferred embodiment of a spacecraft 1000 according to the present invention with an array 800 in a position of partial deployment. FIG. 18 shows the spacecraft 1000 with the array 800 in a position of complete deployment. The spacecraft 1000 comprises a bus 1100 having a surface 901, and a solar array 800. The array 800 shown in FIGS. 17 and 18 comprises six solar panels 10A-10F, according to the present invention, attached together by hinge means 175, such as a door hinge, a piano hinge, or a living hinge. Those skilled in the art will understand that this embodiment is not limited to a solar array with six solar panels and that more or less than six solar panels could be used.

The solar panels 10A-10F each comprise a plurality of rows 13A-13F of solar cells and a plurality of collapsible, self-deploying reflectors 25A-25F aligned parallel to each other on the surface of the panel in an alternating fashion. As can be seen, the reflectors 25A-25F and rows 13A-13F are preferably aligned on the solar panels 10A-10F so that their longitudinal axis normal to the spacecraft 1000.

As shown, these solar panels 10A-10F are preferably capable of being folded up accordion style to reduce volume during launch. By virtue of the accordion-style stowage of the array 800, the collapsible, self-deploying reflectors 25A-25E disposed on solar panels 10A-10E collapse when the array 800 is stowed. Each of the reflectors 25A-25E disposed on solar panels 10A-10E will collapse against an opposing surface 700 when the array is in its stowed position.

The reflectors 25A disposed on solar panel 10A collapse against surface 901 of the spacecraft's bus 1100. The reflectors 25B disposed on solar panel 10B collapse against some surface of solar panel 10C, and vice versa. Specifically, in the embodiment shown in FIGS. 17 and 18, the opposing surface 700 against which the reflectors 25B collapse is the surface of reflectors 25C disposed on solar panel 10C. That is, when the array 800 is in its stowed position, the reflectors 25B collapse against reflectors 25C, and vice versa. Similarly, the reflectors 25D disposed on solar panel 10D collapse against reflectors 25E disposed on solar panel 10E, and vice versa. The reflectors 25F disposed on solar panel 10F can be stored without being collapsed, or can be collapsed by some other opposing surface 700 (not shown). When the array 800 is deployed, the collapsible, self-deploying reflectors 25A-25F self-deploy to their deployed, or operational, position.

Although an accordion-folded rigid panel array is shown here, those skilled in the art will understand that the present invention could be employed with essentially any known style panel or array of variously arranged or folded configurations. Also, it could be used with a blanket type array as shown in U.S. Pat. No. 5,961,738 for a Solar Array for Satellite Vehicles to Benton, which is incorporated herein by reference as if set forth in its entirety.

The present invention achieves its intended purposes, objects and advantages over the prior art devices through a new, useful and nonobvious combination of method steps and component elements, with the use of a minimum number of functioning parts, at a reasonable cost to manufacture, and by employing only readily available materials. Although many embodiments are described herein, this invention is not to be limited by the embodiments shown in the drawings or otherwise in the specification. The embodiments disclosed herein are given by way of example and not of limitation, as the invention is only to be limited in accordance with the scope of the appended claims.

The invention claimed is:

1. A solar panel comprising:
 a base having a face;
 a row of solar cells mounted on the face of the base; and
 an elongated, collapsible, self-deploying reflector having
  a first and a second reflecting side when the reflector is in a deployed position, wherein the reflector is mounted on the face of the base so that the first side of the reflector is adjacent to the row of solar cells, and the first reflecting side of the reflector is oriented to reflect radiation incident on the first side onto the adjacent row of solar cells when the reflector is in the deployed position.

2. A solar panel according to claim 1, wherein the row is only one solar cell in width.

3. A solar panel according to claim 1, wherein the reflector comprises a flexible sheet having a reflective surface, the sheet being joined to the base; and an erector for erecting the sheet, the erector being biased towards the erect position whereby, absent external forces, the erector will raise the sheet, thereby deploying the reflector to its operational position.

4. A solar panel according to claim 3, wherein the erector comprises a folded metal plate.

5. A solar panel according to claim 1, wherein the reflector comprises a metal sheet having a reflective surface, the sheet being joined to the base; the sheet being creased longitudinally and being preformed to be biased to form the collapsible reflector, so that whereby, absent external forces, the sheet will raise itself to form the reflector in its deployed position.

6. A solar panel according to claim 5, wherein the metal sheet is preformed so that each of the sides of the reflector has a roughly concave shape when the reflector is in its deployed position.

7. A solar panel according to claim 5, wherein the metal sheet is titanium.

8. A solar panel according to claim 5, wherein the metal sheet is titanium and has a thickness of approximately 0.0015 inches.

9. A solar panel according to claim 1, wherein the solar cells in the row are electrically connected to the other solar cells in the row by electrical interconnect wiring, the electrical interconnect wiring being substantially under an adjacent reflector.

10. A solar panel according to claim 1, wherein the row is one solar cell in width, and the solar cells have dual ohmics, the dual ohmics being substantially under an adjacent reflector.

11. A solar panel according to claim 1, wherein the row is one solar cell in width, the solar cells have dual ohmics, and the solar cells in the row are electrically connected to the other solar cells in the row by electrical interconnect wiring, the interconnect wiring being substantially under an adjacent reflector.

12. A solar panel according to claim 1, wherein at least two of the solar cells in the row are electrically connected to each other in parallel by electrical interconnect wiring, the electrical interconnect wiring being substantially under an adjacent reflector.

13. A solar panel comprising:
a base having a face;
a plurality of spaced-apart rows of solar cells; and
a plurality of elongated collapsible, self-deploying reflectors, each reflector having a first and a second reflecting side when the reflector is in a deployed position, wherein the reflectors and the rows are mounted on the face of the base in an alternating fashion so that the first side of each of the reflectors is adjacent to a row of solar cells, and the first reflecting side is oriented to reflect radiation incident on the first side onto the adjacent row of solar cells when the reflector is in the deployed position.

14. A solar panel as in claim 13, wherein at least one of the reflectors is disposed between two adjacent rows so that when the at least one reflector is in the deployed position the first reflecting side is oriented to reflect radiation incident on the first side onto the first adjacent row of solar cells and the second reflecting side reflects radiation incident on the second side onto the second adjacent row of solar cells.

15. A solar panel according to claim 13, wherein each row is only one solar cell in width.

16. A solar panel according to claim 13, wherein each reflector comprises a flexible sheet having a reflective surface, the sheet being joined to the base; and an erector for erecting the sheet, the erector being biased towards the erect position whereby, absent external forces, the erector will raise the sheet, thereby deploying the reflector to its operational position.

17. A solar panel according to claim 16, wherein the erector comprises a folded metal plate.

18. A solar panel according to claim 13, wherein each reflector comprises a metal sheet having a reflective surface, the sheet being joined to the base; the sheet being creased longitudinally and being preformed to be biased to form the reflector, so that whereby, absent external forces, the sheet will raise itself to form the reflector in its deployed position.

19. A solar panel according to claim 18, wherein the metal sheet is preformed so that each of the sides of the reflector has a roughly concave shape when the reflector is in its deployed position.

20. A solar panel according to claim 18, wherein the metal sheet is titanium.

21. A solar panel according to claim 18, wherein the metal sheet is titanium and has a thickness of approximately 0.0015 inches.

22. A solar panel according to claim 13, wherein the solar cells in a row are electrically connected to the other solar cells in the row by electrical interconnect wiring, the electrical interconnect wiring being substantially under an adjacent reflector.

23. A solar panel according to claim 13, wherein the rows are one solar cell in width, and the solar cells have dual ohmics, the dual ohmics being substantially under an adjacent reflector.

24. A solar panel according to claim 13, wherein the rows are one solar cell in width, the solar cells have dual ohmics, and the solar cells in a row are electrically connected to the other solar cells in the row by electrical interconnect wiring, the interconnect wiring being substantially under an adjacent reflector.

25. A solar panel according to claim 13, wherein at least two of the solar cells in one of the rows are electrically connected to each other in parallel by electrical interconnect wiring, the electrical interconnect wiring being substantially under an adjacent reflector.

26. A solar panel comprising:
a base;
a plurality of spaced-apart parallel rows of solar cells mounted on the base; and
a collapsible and self-deploying reflector mounted on the base between each of the rows of solar cells, the reflector comprising two reflective sides that are oriented to reflect incident energy onto the adjacent rows of solar cells.

27. A solar cell array, comprising:
a first column of solar cells;
a second column of solar cells;
a compressible and self-deploying concentrator positioned between the first column of solar cells and the second column of solar cells, wherein the concentrator is compressible to a first height and extendible to a second height.

28. A solar cell array according to claim 27, further comprising a means for urging the concentrator from the first height to the second height.

29. A solar cell array according to claim 27, further comprising a deployment means urging the reflector to the second position.

30. A solar cell array, comprising:

a plurality of spaced-apart rows of solar cells;

a reflector positioned between two of the rows of solar cells, the reflector compressible to a first position and configured to self-deploy from the first position to a second position.

* * * * *